United States Patent
ur Rahman et al.

(10) Patent No.: US 11,239,846 B1
(45) Date of Patent: Feb. 1, 2022

(54) VARIABLE-LENGTH CLOCK STRETCHER WITH CORRECTION FOR GLITCHES DUE TO PHASE DETECTOR OFFSET

(71) Applicant: SambaNova Systems, Inc., Palo Alto, CA (US)

(72) Inventors: Fahim ur Rahman, Sunnyvale, CA (US); Jin-Uk Shin, San Jose, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/338,625

(22) Filed: Jun. 3, 2021

Related U.S. Application Data

(60) Provisional application No. 63/195,664, filed on Jun. 1, 2021.

(51) Int. Cl.
  *H03L 7/081* (2006.01)
  *H03K 5/1252* (2006.01)
  *H03L 7/089* (2006.01)

(52) U.S. Cl.
  CPC ......... *H03L 7/0818* (2013.01); *H03K 5/1252* (2013.01); *H03L 7/089* (2013.01); *H03L 7/0814* (2013.01); *H03L 7/0816* (2013.01)

(58) Field of Classification Search
  CPC ... H03L 7/0818; H03L 7/0814; H03L 7/0816; H03L 7/089; H03K 5/1252
  USPC ...................................................... 327/158
  See application file for complete search history.

(56) References Cited

U.S. PATENT DOCUMENTS

| | | | | |
|---|---|---|---|---|
| 3,517,300 A * | 6/1970 | McMurray | ............ | H02M 5/225 363/25 |
| 5,947,093 A * | 9/1999 | Ward | ........................ | F02P 3/08 123/598 |
| 6,608,528 B2 * | 8/2003 | Tam | ...................... | G06F 1/3203 331/2 |
| 6,628,276 B1 * | 9/2003 | Elliott | .................... | H04N 5/126 345/213 |
| 6,826,247 B1 * | 11/2004 | Elliott | .................... | G09G 5/008 375/376 |
| 6,891,303 B2 * | 5/2005 | Leijon | ................... | H01F 27/323 310/196 |
| 6,922,111 B2 | 7/2005 | Kurd et al. | | |
| 7,675,332 B1 * | 3/2010 | Kwasniewski | ....... | H03L 7/0814 327/158 |
| 7,688,150 B2 * | 3/2010 | Kurd | ...................... | H03L 7/101 331/44 |
| 7,724,078 B2 * | 5/2010 | Kurd | ........................ | H03L 7/08 327/544 |
| 7,821,312 B1 * | 10/2010 | Zheng | ................... | H03L 7/0996 327/158 |

(Continued)

*Primary Examiner* — Adam D Houston
(74) *Attorney, Agent, or Firm* — Haynes Beffel & Wolfeld LLP; Bruce A. Young

(57) ABSTRACT

A clock stretcher includes a DLL that derives delayed versions of an input clock signal, and a combiner that cyclically selects the delayed versions to generate a modified clock signal. The combiner uses a hop code, dependent on a sensed condition, to determine the step size for the cyclical selection. The DLL may have a phase error that would cause a glitch in the modified clock during phase selection wraparound. The clock stretcher proactively increases the step size during wraparound by adding an offset skip parameter value to the hop code. The clock stretcher may operate from a sensed power supply without intervening voltage regulation.

19 Claims, 13 Drawing Sheets

(56) References Cited

U.S. PATENT DOCUMENTS

| | | | | |
|---|---|---|---|---|
| 7,929,498 B2* | 4/2011 | Ozluturk | | H04W 52/24 370/335 |
| 8,933,737 B1* | 1/2015 | Chatterjee | | H03L 7/095 327/159 |
| 9,065,321 B2* | 6/2015 | Divan | | H02M 7/4807 |
| 9,413,344 B2* | 8/2016 | Bowman | | G06F 1/10 |
| 9,444,275 B2* | 9/2016 | Huang | | H02J 7/0068 |
| 9,806,701 B1* | 10/2017 | Bellaouar | | G06F 7/68 |
| 10,009,016 B1* | 6/2018 | Ho | | G06F 1/10 |
| 10,063,158 B1* | 8/2018 | Li | | H02M 3/33584 |
| 10,069,430 B2* | 9/2018 | Sahoo | | H02M 7/483 |
| 10,348,281 B1* | 7/2019 | Oliver | | H03K 19/00369 |
| 10,409,317 B2* | 9/2019 | Saint-Laurent | | G06F 1/3206 |
| 10,425,088 B2* | 9/2019 | Muench | | G06F 1/3287 |
| 10,425,089 B2* | 9/2019 | Kosonocky | | H03K 3/0307 |
| 10,587,250 B2* | 3/2020 | Hanke | | G06F 1/324 |
| 10,587,253 B1* | 3/2020 | Huang | | G06F 1/305 |
| 10,686,582 B1* | 6/2020 | Pasdast | | H03L 7/093 |
| 10,901,018 B2* | 1/2021 | Sugumar | | G01R 31/3004 |
| 10,924,121 B1* | 2/2021 | Abuellil | | H03L 7/0814 |
| 10,996,738 B2* | 5/2021 | Sugumar | | G06F 1/10 |
| 11,021,069 B1* | 6/2021 | Elshaer | | H02M 3/33584 |
| 2003/0179842 A1* | 9/2003 | Kane | | H03K 5/133 375/376 |
| 2004/0227560 A1* | 11/2004 | de Buda | | H03K 17/6874 327/427 |
| 2005/0111246 A1* | 5/2005 | Lai | | H02M 7/483 363/157 |
| 2007/0127182 A1* | 6/2007 | Chang | | H03K 17/0822 361/100 |
| 2007/0210842 A1* | 9/2007 | Kawamoto | | H03L 7/0816 327/158 |
| 2009/0168942 A1* | 7/2009 | Choi | | H03L 7/0816 375/373 |
| 2009/0224807 A1* | 9/2009 | Philippe | | H03K 5/1565 327/105 |
| 2009/0225569 A1* | 9/2009 | Begalke | | H02M 3/3378 363/17 |
| 2010/0036211 A1* | 2/2010 | La Rue | | A61B 5/0002 600/301 |
| 2010/0194456 A1* | 8/2010 | Kang | | H03K 5/00006 327/158 |
| 2011/0221495 A1* | 9/2011 | Lee | | G11C 7/222 327/158 |
| 2012/0120697 A1* | 5/2012 | Cuk | | H02M 1/4216 363/126 |
| 2012/0139592 A1* | 6/2012 | Bo | | H03L 7/16 327/156 |
| 2012/0187991 A1* | 7/2012 | Sathe | | H03K 5/135 327/158 |
| 2012/0319483 A1* | 12/2012 | Scruggs | | H02J 1/10 307/52 |
| 2013/0051102 A1* | 2/2013 | Huang | | H02M 7/217 363/127 |
| 2013/0201733 A1* | 8/2013 | Divan | | H02M 5/225 363/39 |
| 2013/0287065 A1* | 10/2013 | Sun | | H04L 27/2032 375/146 |
| 2014/0009189 A1* | 1/2014 | Mauder | | H01L 29/7786 327/109 |
| 2014/0340132 A1* | 11/2014 | Terrovitis | | H03L 7/0816 327/157 |
| 2014/0362952 A1* | 12/2014 | Cheng | | H04L 27/156 375/303 |
| 2015/0229227 A1* | 8/2015 | Aeloiza | | H02M 5/04 323/355 |
| 2015/0280595 A1* | 10/2015 | White | | H02M 5/297 318/778 |
| 2015/0365003 A1* | 12/2015 | Sadwick | | H02M 3/28 363/21.01 |
| 2016/0241137 A1* | 8/2016 | Sun | | H02J 4/00 |
| 2017/0099008 A1* | 4/2017 | Keister | | H02M 5/458 |
| 2017/0331387 A1* | 11/2017 | Gougerchian | | H02M 5/257 |
| 2017/0346414 A1* | 11/2017 | Mondal | | H05B 41/2824 |
| 2018/0198377 A1* | 7/2018 | Keister | | H02M 1/42 |
| 2018/0267480 A1* | 9/2018 | Mahajan | | G05F 1/561 |
| 2018/0309456 A1* | 10/2018 | Grollitsch | | H03L 7/085 |
| 2018/0358814 A1* | 12/2018 | Rates Palau | | H02J 9/04 |
| 2019/0280586 A1* | 9/2019 | Chen | | H02J 3/18 |
| 2019/0296634 A1* | 9/2019 | Ikeda | | H03K 17/168 |
| 2019/0312521 A1* | 10/2019 | Cao | | H02M 5/4585 |
| 2019/0326280 A1* | 10/2019 | Imam | | H03K 17/6874 |
| 2020/0059190 A1* | 2/2020 | Kim | | B60L 15/20 |
| 2021/0013743 A1* | 1/2021 | Hu | | H02J 50/12 |
| 2021/0044233 A1* | 2/2021 | Glose | | H02P 27/12 |
| 2021/0091767 A1* | 3/2021 | Cairoli | | H03K 17/102 |
| 2021/0135588 A1* | 5/2021 | Prasad | | G01R 1/0491 |
| 2021/0250030 A1* | 8/2021 | Abuellil | | H03K 19/20 |
| 2021/0250031 A1* | 8/2021 | Abuellil | | H03L 7/0814 |

* cited by examiner

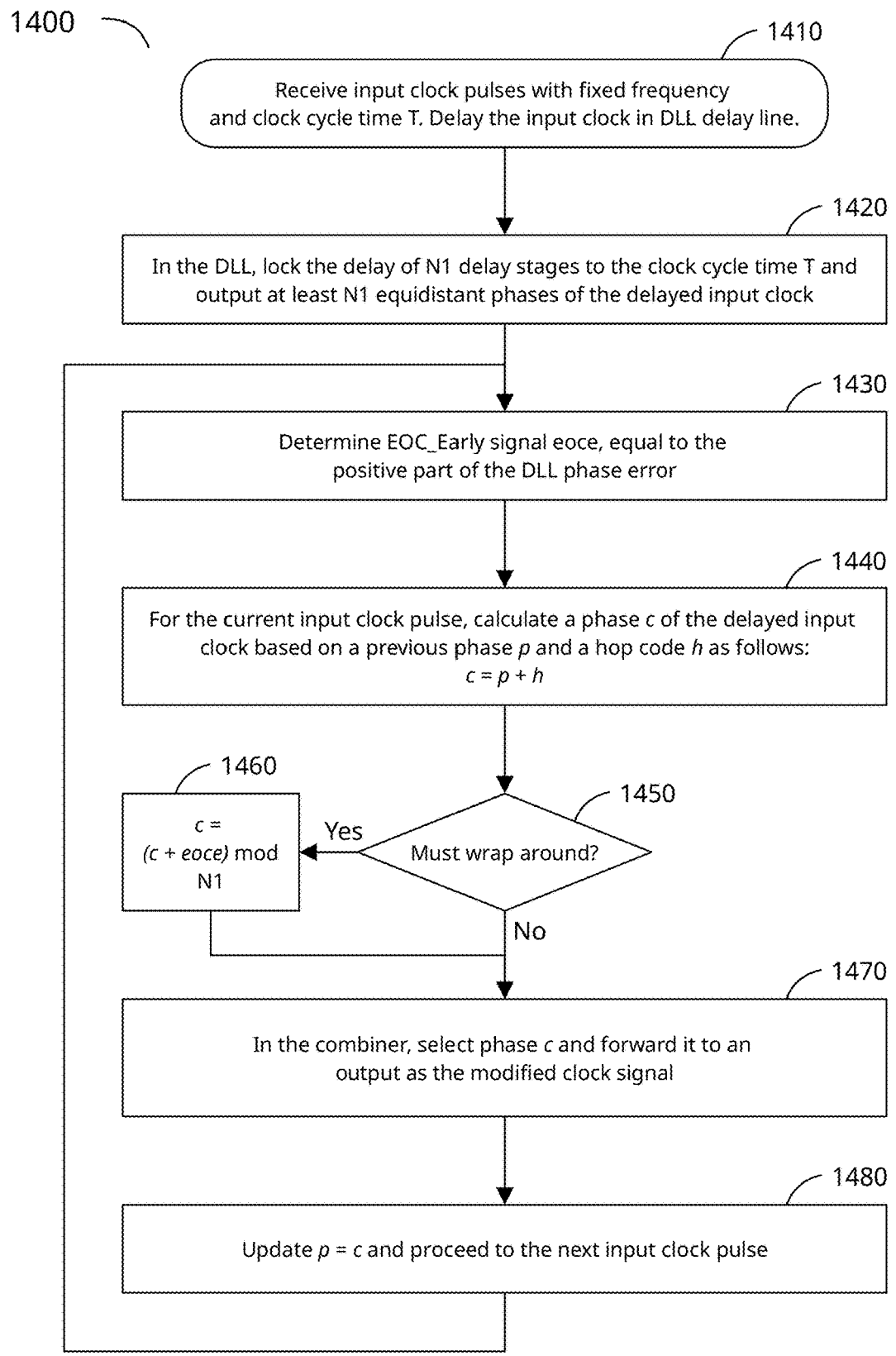
FIG. 14 – Finite DLL Bandwidth Glitch Correction

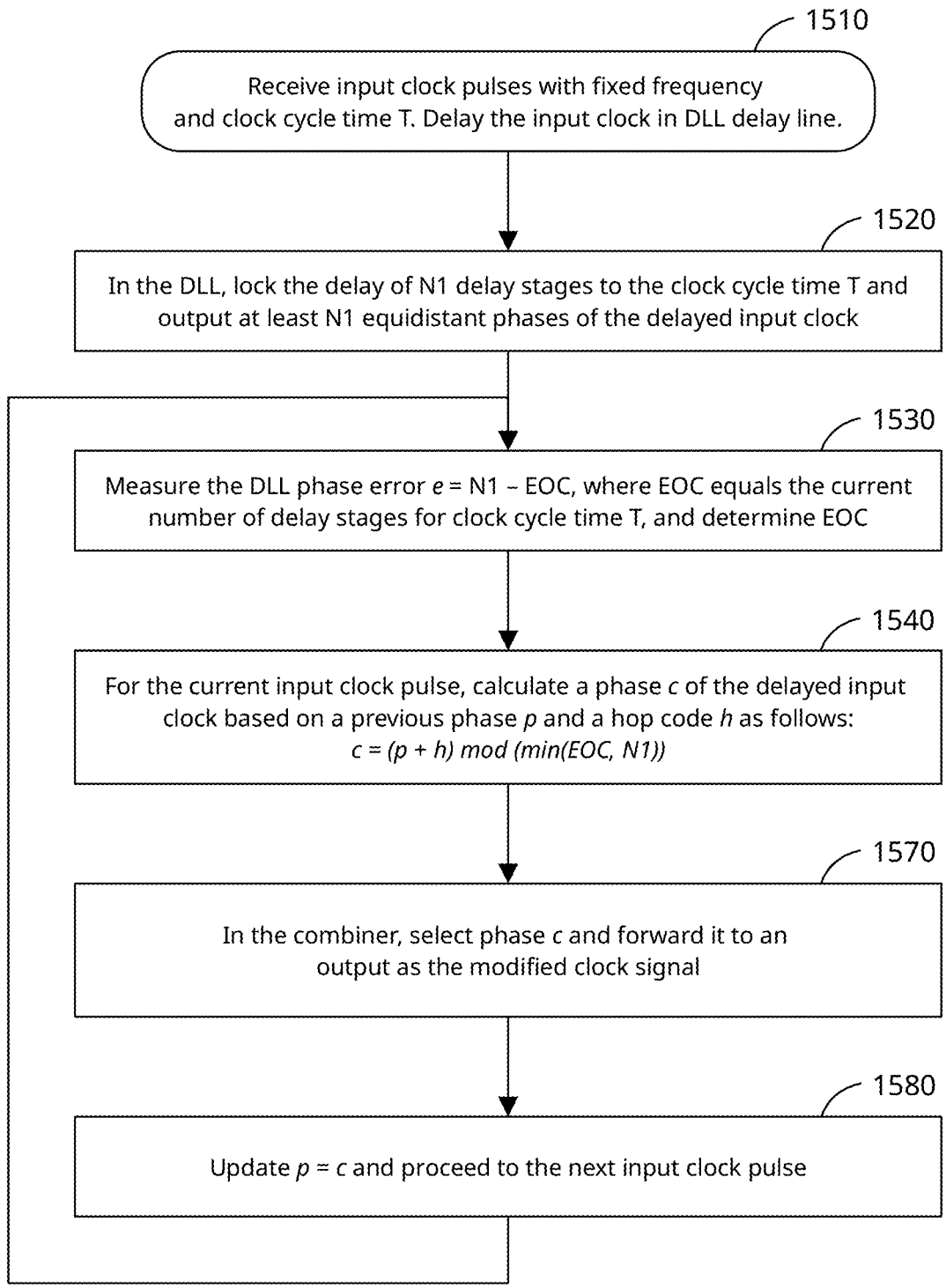
FIG. 15 – Finite DLL Bandwidth Glitch Correction

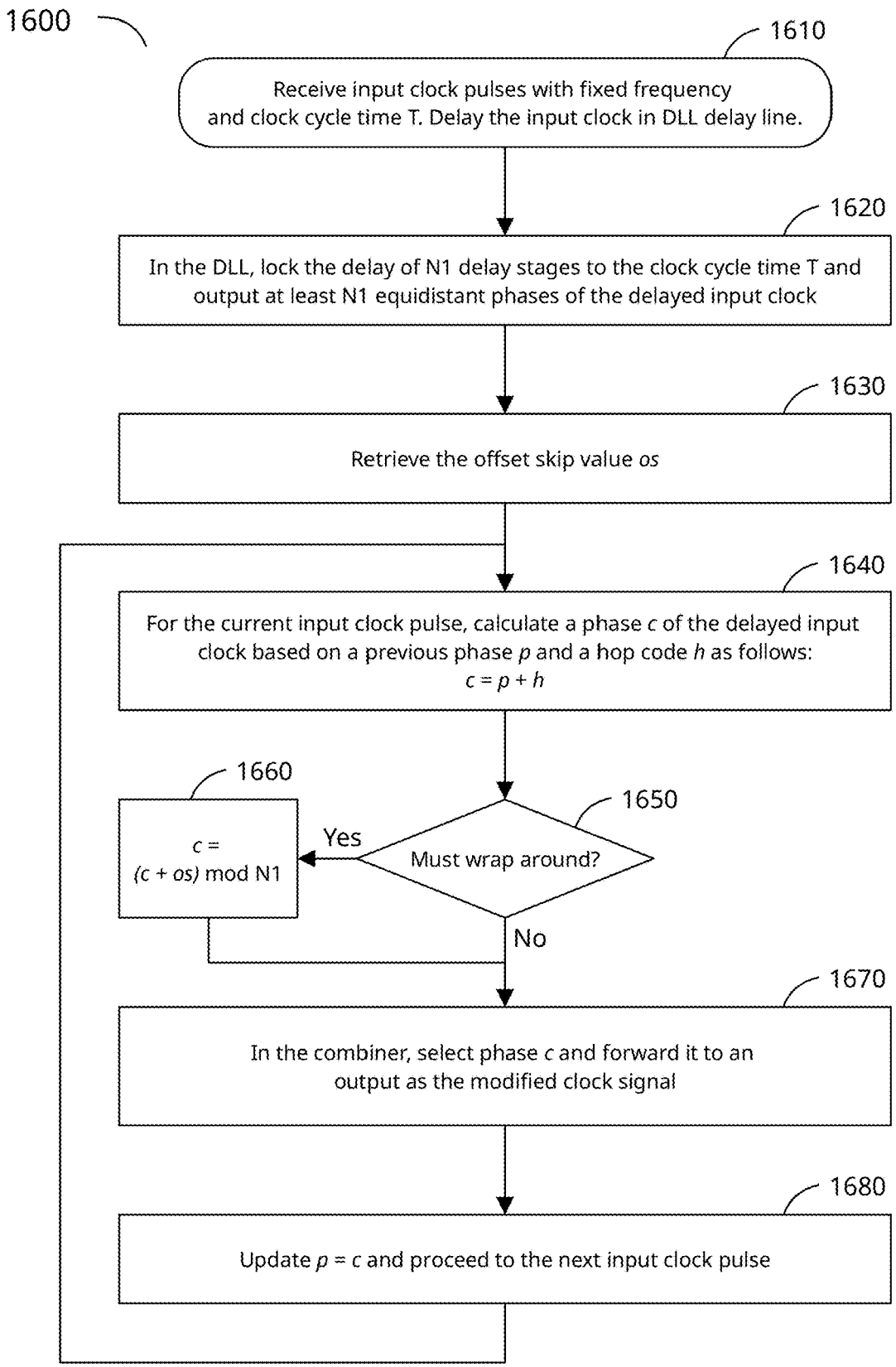
FIG. 16 – Correction of Phase Detector Offset Glitches

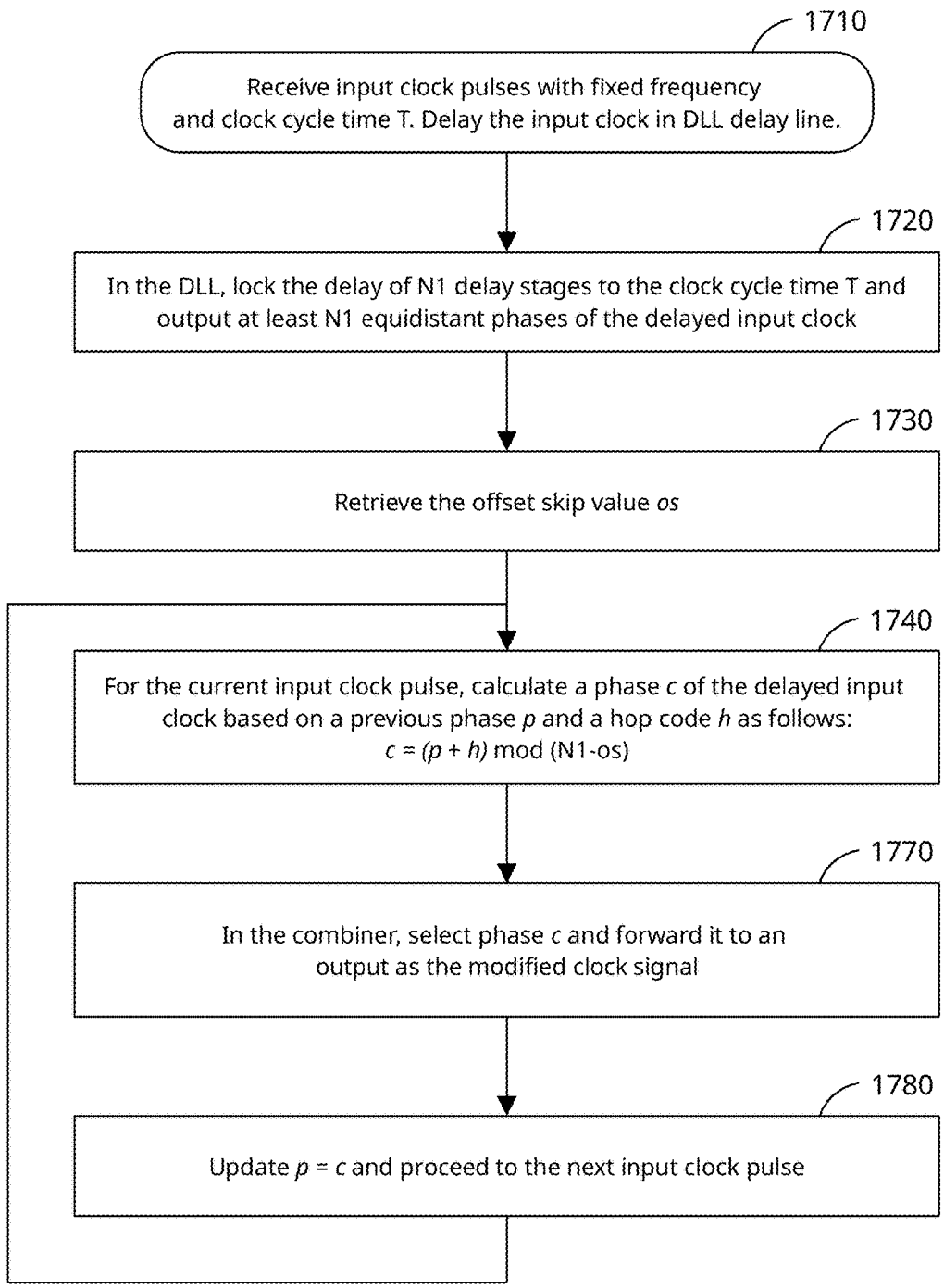
FIG. 17 – Correction of Phase Detector Offset Glitches

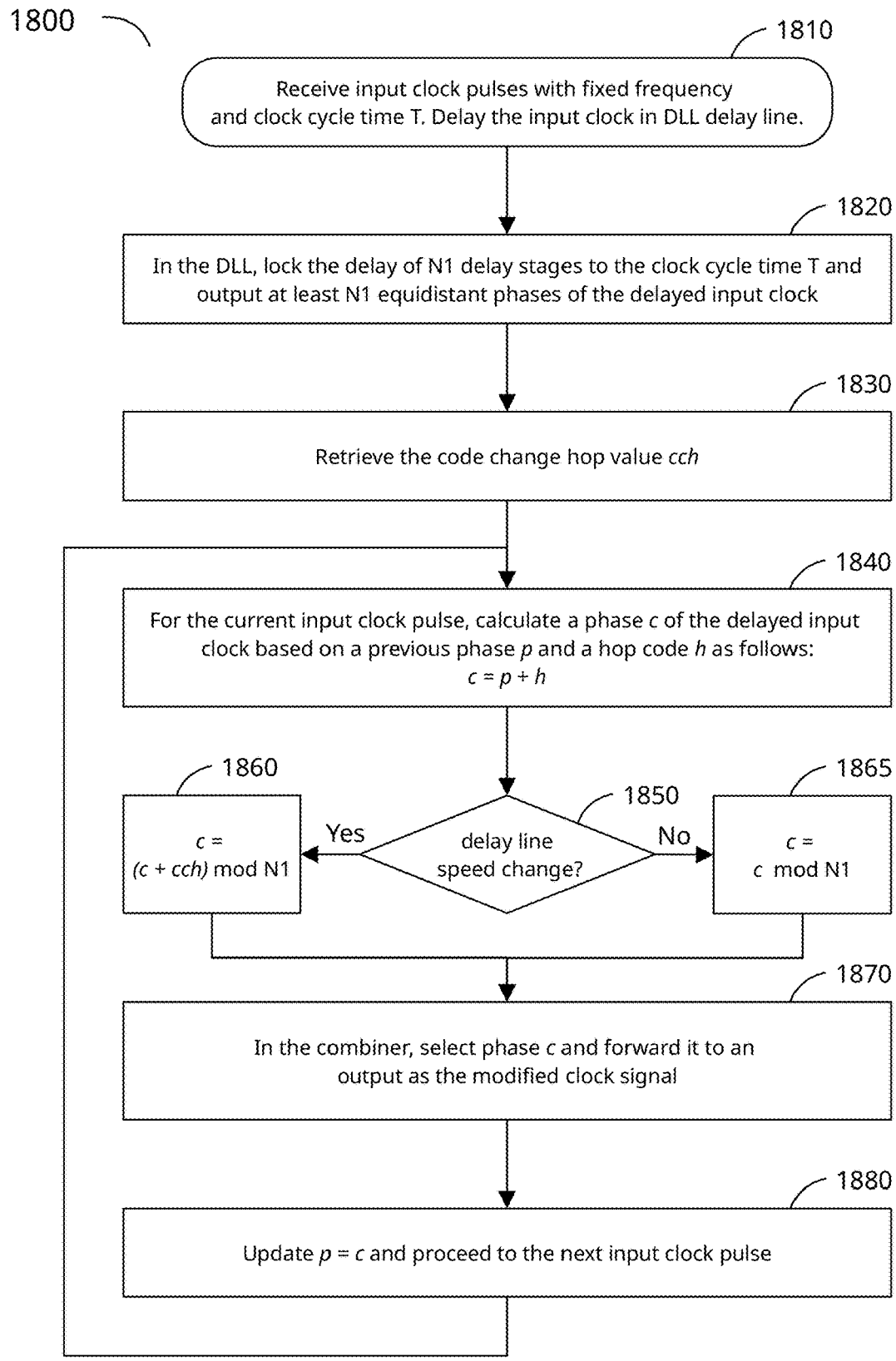
FIG. 18 – Digital DLL Glitch Correction

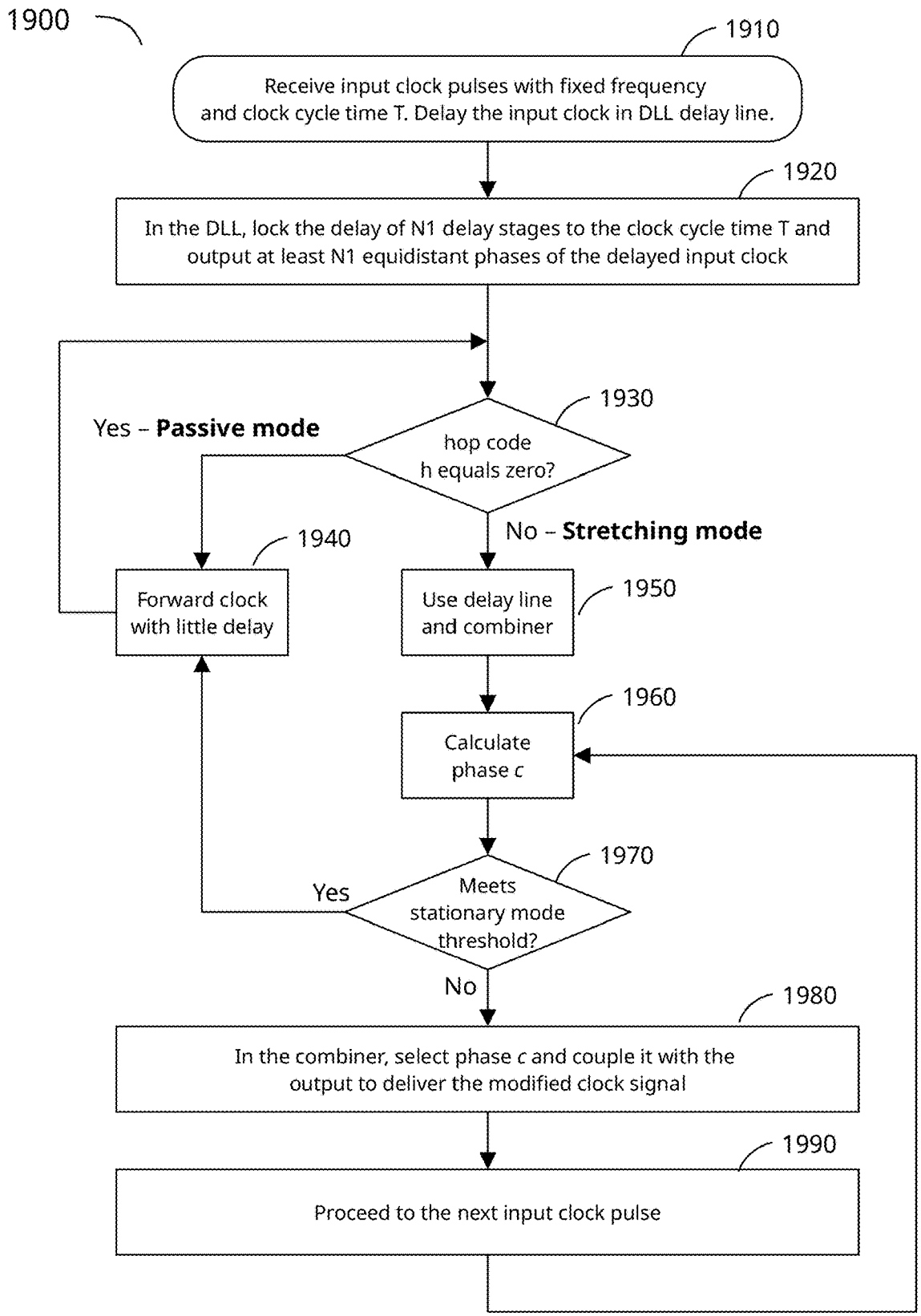
FIG. 19 – Passive Mode Jitter Reduction

VARIABLE-LENGTH CLOCK STRETCHER WITH CORRECTION FOR GLITCHES DUE TO PHASE DETECTOR OFFSET

CROSS-REFERENCE

This application claims the benefit of U.S. Provisional Patent Application No. 63/195,664, entitled, "Variation-tolerant variable-length clock-stretcher module with in-situ end-of-chain detection mechanism," filed on Jun. 1, 2021. The priority application is hereby incorporated by reference herein for all purposes.

RELATED APPLICATION(S)

This application is related to the following commonly owned applications:

U.S. patent application Ser. No. 17/338,620, entitled, "Variable-Length Clock Stretcher with Correction for Glitches Due to Finite DLL Bandwidth," filed concurrently herewith;

U.S. patent application Ser. No. 17/338,626, entitled, "Variable-Length Clock Stretcher with Correction for Digital DLL Glitches," filed concurrently herewith; and U.S. patent application Ser. No. 17/338,629, entitled, "Variable-Length Clock Stretcher with Passive Mode Jitter Reduction," filed concurrently herewith.

The related application(s) are hereby incorporated by reference herein for all purposes.

BACKGROUND

Technical Field

The disclosed embodiments relate generally to systems and methods used in clocking electronics, and in particular to those for adaptively clocking circuits with a variable load.

Context

Unless otherwise indicated herein, elements described in this section are not prior art to the claims and are not admitted being prior art by inclusion in this section.

Central Processing Units (CPUs), processors for Artificial Intelligence (AI) applications, and other clocked digital electronics may be implemented as systems on a chip (SoCs), often requiring a large amount of power to operate. Based on the overall processing requirements, and possibly software being executed, the instantaneous load on the supply power can vary sharply, which may result in sharp changes in the supply voltage. A droop in the supply voltage may slow down electronic circuits, and a peak may increase their speed. Both droops and peaks may therefore impact the operation of a processor. Especially droops may result in timing violations when a digital circuit operates from a clock whose frequency is too high for the imminent supply voltage and, consequently, the digital circuit may fail functionally. Even a single clock pulse that is too short must be considered a glitch that can result in timing violations and a functional failure. In general, a processor has a maximum clock frequency that depends on the supply voltage available. Thus, a clock for a processor operating at its maximum clock frequency may need to be slowed down when the processor supply voltage decreases. One system that can do so is a clock stretcher, which can stretch the length of one or more successive clock pulses to temporarily slow down a clock.

However, conventional clock stretchers require a clean supply themselves. They often employ a delay line whose delay directly depends on the supply voltage. Conventional solutions embed the delay line with a phase detector in an analog delay-locked loop (DLL), a negative feedback loop that counters the influence of the supply voltage on the delay. To ensure stability, the DLL feedback loop is designed with a limited bandwidth, and the DLL cannot keep up with supply voltage changes that are too fast. Conventionally, the delay line must have a high resolution, which increases power consumption and die area, and limits the clock frequency range. DLL phase detector offset can introduce further inaccuracies. Unfortunately, modern semiconductor fabrication processes make it difficult to design a phase detector with a low offset. An analog DLL is very dependent on having a dedicated clean power supply. This can be overcome by using a digital DLL, but a digital DLL operates in discrete time steps, which may cause a shortened clock pulse at the time of a DLL adjustment. The shortened clock pulse may cause timing violations and functional failure.

When a clock stretcher is integrated with a powerful processor, or other electronic system with sharply variable load, a clean supply may be expensive or not be readily available. Embodiments of the invention address several of the problems that may occur due to polluted supply voltages and due to using a digital DLL.

SUMMARY

Central Processing Units (CPUs), processors for Artificial Intelligence (AI) applications, and other clocked systems may be implemented as large systems on a chip (SoCs), requiring large power to operate. Based on the overall processing requirement, and software being executed, the instantaneous load on the supply power can vary sharply, which may result in sudden changes in the supply voltage. A droop in the supply voltage may slow down electronic circuits, and result in timing violations and functional failures. In general, a processor has a maximum clock frequency that depends on the available supply voltage. Thus, a clock for a processor operating at or near its maximum clock frequency may need to be slowed down when the processor supply voltage decreases.

Embodiments of the invention provide a clock stretcher that is operable to receive an input clock signal whose frequency is fixed and to output a modified clock signal whose frequency is equal to or lower than the received frequency, based on one or more sensed conditions. The sensed condition may include the voltage of supplied power. The clock stretcher may include a sense unit for sensing the condition, a delay-locked loop (DLL) for deriving a series of delayed versions of the input clock signal, a combiner for selecting one or more of the delayed versions of the input clock signal, and a control unit that receives information from the sense unit and the DLL and controls the DLL and the combiner to generate the modified clock as required. Embodiments may operate from the supplied power without intervening voltage regulation.

In a first aspect of the invention, an embodiment provides a method to correct glitches due to phase detector offset in a delay-locked loop (DLL) in the clock stretcher. The input clock signal includes input clock pulses with a clock cycle time T. The method includes the following steps. It delays the input clock pulses in a delay line in the DLL. The delay line includes delay stages. The DLL locks a delay of N1 stages to clock cycle time T, and forwards the N1 equidistant phases of the delayed input clock pulses to the combiner.

The combiner cyclically selects at least one of the N1 equidistant phases with the clock stretcher output to generate the modified clock. For successive clock pulses, the combiner successively selects phases, where the step size is determined by a hop code dependent on the sensed condition. The method retrieves an offset skip parameter value os, and uses os during a phase selection wraparound to correct for a phase detector offset glitch.

In a second aspect of the invention, and embodiment provides a clock stretcher. The clock stretcher comprises a DLL that has a delay line with delay stages, an end-of-chain (EOC) detector, a required length interface that provides required length N1, and a control unit. The control unit receives a hop code h and an offset skip value os. It outputs a combiner control signal that includes a cyclical selection of N1 delay line phase output signals. The selection is based on N1, h, and the offset skip value os.

The embodiment calculates the selection by adding h to a previous phase p. It wraps phase selection around at N1 minus os, or at N1. If it wraps around at N1, the embodiment adds os to the calculated selection.

Particular aspects of the technology disclosed are described in the claims, specification and drawings.

BRIEF DESCRIPTION OF THE DRAWINGS

The invention will be described with reference to the drawings, in which:

FIG. 14 illustrates a first method to correct glitches due to finite DLL bandwidth in a clock stretcher according to an embodiment of the invention;

FIG. 15 illustrates a second method to correct glitches due to finite DLL bandwidth in a clock stretcher according to an embodiment of the invention;

FIG. 16 illustrates a first method to correct glitches due to phase detector offset in a clock stretcher according to an embodiment of the invention;

FIG. 17 illustrates a second method to correct glitches due to phase detector offset in a clock stretcher according to an embodiment of the invention;

FIG. 18 illustrates a method to correct glitches due to delay line speed discontinuities in a clock stretcher according to an embodiment of the invention; and FIG. 19 illustrates a method to prevent output jitter in a clock stretcher in passive mode according to an embodiment of the invention.

Figure 1:
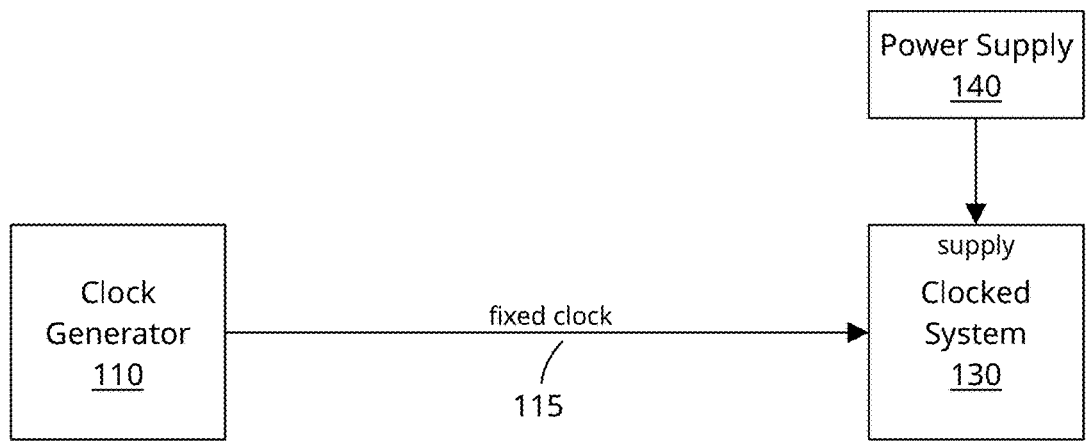
FIG. 1 illustrates a conventional clocked system using a fixed clock.

In the figures, like reference numbers may indicate functionally similar elements. The systems and methods illustrated in the figures, and described in the Detailed Description below, may be arranged and designed in a wide variety of different embodiments. Neither the figures, nor the Detailed Description, are intended to limit the scope as claimed. Instead, they merely represent examples of different embodiments of the invention.

DETAILED DESCRIPTION

The following detailed description is made with reference to the figures. Example implementations are described to illustrate the technology disclosed, not to limit its scope, which is defined by the claims. Those of ordinary skill in the art will recognize a variety of equivalent variations on the description that follows.

Terminology

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

AI—Artificial Intelligence.

CMOS—Complementary Metal-Oxide-Semiconductor—a type of field-effect transistor integrated circuit fabrication process.

CPU—central processing unit—an electronic circuit that executes software instructions.

DC—direct current—a current or voltage whose direction does not change.

DC-to-DC converter—an electronic circuit that converts power from one DC voltage to another DC voltage.

Delay Line—in the context of this document, a delay line is an electronic circuit composed of a series of delay stages through which a signal may travel. The delay stages are nominally equidistant, i.e., the provide equal delays. In practice, even equidistant delay stages may have delay deviations, resulting in output noise. At least part of the delay stages may have an output, and the outputs provide progressively delayed versions of a signal traveling through the delay line.

DLL—delay-locked loop—an electronic circuit with a delay line that synchronizes the delay line speed with the clock cycle of a reference input signal. It outputs one or more delayed versions of the reference input signal on one or more delay line outputs.

DVFS—Dynamic Voltage and Frequency Scaling—adjustment of power and clock frequency of a processor to optimize usage of resources.

EOC—End of Chain—the imminent number of stages through which one clock cycle of a fixed-frequency input clock travels.

FET—Field-Effect Transistor

GPU—graphics processing unit—a processor that is optimized for processing large data streams such as are used in moving graphics.

IC—integrated circuit, also called chip or semiconductor chip.

JFET—Junction Field-Effect Transistor.

LC oscillator—an oscillator employing an inductor (L) and a capacitor (C).

MCM—Multichip Module—an electronic package that includes multiple ICs performing as a single module.

MESFET—metal-semiconductor field-effect transistor.

NAND—Not And—a Boolean function.

NOR—Not Or—a Boolean function.

MOSFET—a metal-oxide-semiconductor field-effect transistor, the predominant type of transistor used in digital and mixed-signal ICs.

PCB—Printed Circuit Board

PVT—semiconductor die conditions that impact the behavior of integrated electronic devices: process, voltage, and temperature.

SoC—system-on-a-chip—an IC that integrates a large amount of functionality.

The Concept

Conventional clock stretchers that include a DLL require a clean power supply and cannot be directly fed from the power supply of the system for which they are modifying a fixed clock's frequency. This problem is much reduced by using a digital DLL. But a digital DLL causes glitches because it changes the timing of clock pulses abruptly. Embodiments address this by proactively compensating for the glitch by lengthening the duration of an output clock pulse when a DLL timing change occurs. As a result of this compensation, the need for a fine resolution delay line is much decreased, allowing for a larger stretching range.

Even a digital DLL may have a delay time that is impacted by the DLL's power supply, as well as by the DLL's finite bandwidth for correcting phase errors. Embodiments monitor any deviations from the DLL's intended delay, and prevent glitches at phase selection wraparound that would be caused by such deviations. Embodiments monitor the delay deviations for every cycle of the fixed input clock, so that even a deviation immediately preceding phase selection wraparound gets corrected.

Unlike conventional clock stretchers, an embodiment can change the actively used part of the delay line length in runtime. For a clocked system that includes one or more processors, the fixed input frequency may change during DVFS. An embodiment can handle such a frequency change by adapting its active delay line length without malfunction.

DLLs also have glitches at phase selection wraparound related to the resolution of their delay lines. One such glitch is caused by phase detector offset. An embodiment addresses those glitches by proactively lengthening the duration of an output clock pulse when a wraparound occurs. Another glitch is caused by the limited DLL bandwidth, which causes a phase error that the DLL uses to synchronize its delay to the incoming clock pulses. The phase error causes glitches at the time of phase selection wraparound. An embodiment addresses those glitches by modifying the wraparound point proportionally to the phase error.

DLL delay lines are noisy, and a selected phase near the end of the delay line can be jittery. An embodiment addresses this problem either by bypassing the delay line, while compensating for a delay line offset, or by selecting a phase from the delay line that is no more than 10 delay stages from the beginning of the delay line.

Embodiments

General

Central Processing Units (CPUs), processors for Artificial Intelligence (AI) applications, and other clocked systems may be implemented as large systems on a chip (SoCs), requiring a large amount of power to operate. Based on the overall processing requirement, and software being executed, the instantaneous load on the supply power can vary sharply, which may result in sudden changes in the supply voltage. A droop in the supply voltage may slow down electronic circuits, and result in timing violations and functional failures. In general, a processor has a maximum clock frequency that depends on the available supply voltage. Thus, a clock for a processor operating at or near its maximum clock frequency may need to be slowed down when the processor supply voltage decreases.

FIG. 1 illustrates a conventional system 100 using a fixed clock. Conventional system 100 includes clock generator 110 which produces fixed clock 115, used for clocked system 130. Clocked system 130 operates from power supply 140. In some cases, power supply 140 also provides power to clock generator 110. Clocked system 130 may comprise any digital or mixed-signal system that uses a clock signal for clocking synchronous digital logic circuits, and may include an SoC, an MCM, a PCB, or any other module that includes synchronous digital circuits. For example, clocked system 130 may include a chip with one or more processors, such as a CPU, GPU, or AI chip. Clock generator 110 may include as oscillator, such as a crystal oscillator, an LC oscillator, a ring oscillator, or any other oscillator; a frequency generator to take an oscillator output signal and generate a clock signal with another frequency, for example a much higher frequency; a buffer; and any other circuit to produce a fixed clock normally suitable for clocking clocked system 130. Power supply 140 may include a battery, a DC-to-DC converter, a voltage regulator, a current regulator, and any other circuit commonly used in the art to supply a clocked system with electric power.

Figure 2:
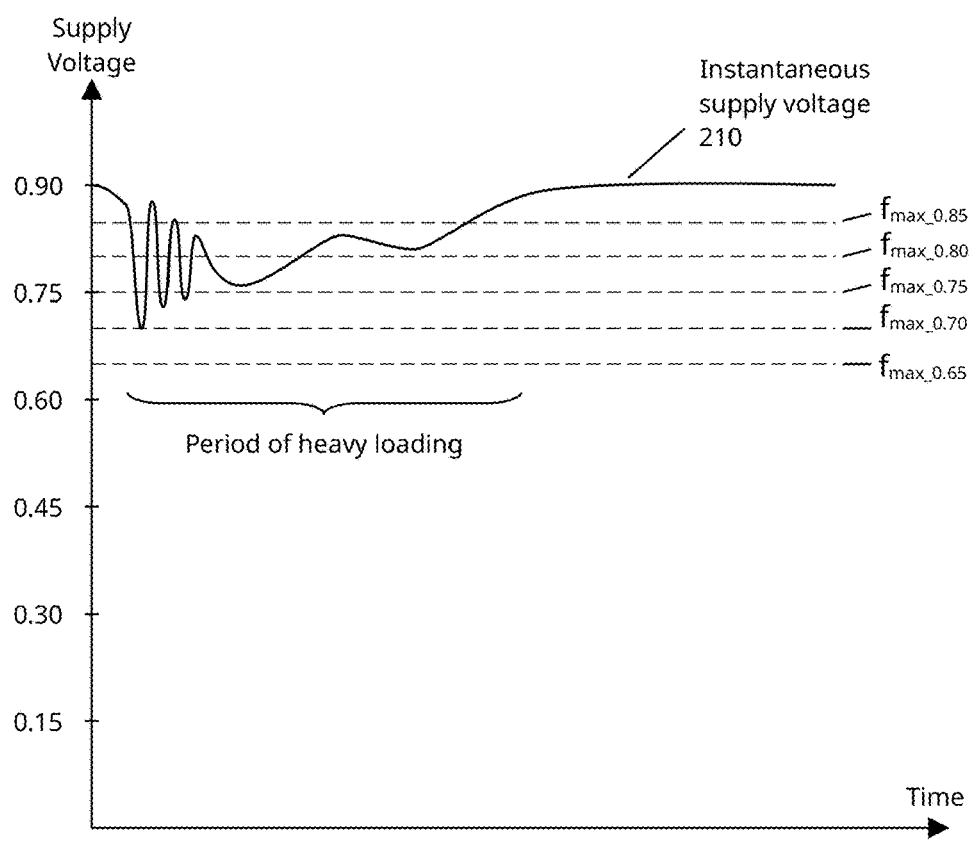
FIG. 2 illustrates that a period of heavy loading causes droops in the supply voltage, which may cause a clocked system to have a lower maximum operational clock frequency.

FIG. 2 illustrates that a period of heavy loading causes droops in the supply voltage, which may cause a clocked system to have a lower maximum operational clock frequency. Chart 200 shows an example of an instantaneous supply voltage 210 as a function of time, including a period of heavy loading. For example, if clocked system 130 includes one or more processors executing software or firmware instructions, then it is possible that during the period of heavy loading the software or firmware executes compute-intensive instructions requiring more current than power supply 140 can immediately deliver, resulting in a drop of the supply voltage. As corrective circuits within power supply 140 set in, the supply voltage may bounce up and down a few times before more slowly correcting back to the required supply voltage. The shape of instantaneous supply voltage 210, as a response to a period of heavy loading, may depend on many factors, including the characteristics of power supply 140, parasitics in the physical embodiment of clocked system 130, and the instantaneous requirements posed by software being executed.

Clocked system 130 may require a nominal supply voltage of, for example, 0.9V. It may have been characterized or simulated to operate at a maximum clock frequency $f_{max\_0.85}$ when the supply voltage equals 0.85V. So when the supply voltage is nominally 0.9V it has a safety margin of 0.05V for operation at $f_{max\_0.85}$. At 0.8V, 0.75V, 0.7V and 0.65V it may have been characterized or simulated to operate at maximum clock frequencies $f_{max\_0.85}$, $f_{max\_0.75}$, $f_{max\_0.70}$, and $f_{max\_0.65}$, respectively. These respective frequencies are progressively lower for normal MOSFET semiconductor processes. I.e., if the supply voltage is lower, the maximum clock frequency is lower. If a synchronous digital circuit is operated at a frequency above its maximum clock frequency, timing violations and functional errors occur. Therefore, in the situation depicted in FIG. 2, during the period of heavy loading, instantaneous supply voltage 210 drops to as low as 0.7V, at which the clocked system 130 could only be safely operated at a clock frequency up to $f_{max\_0.65}$. Thus, to prevent failure due to the limitations of power supply 140, clocked system 130 needs to be operated at a clock speed significantly below its performance available at the full supply voltage of 0.9V.

Figure 3:
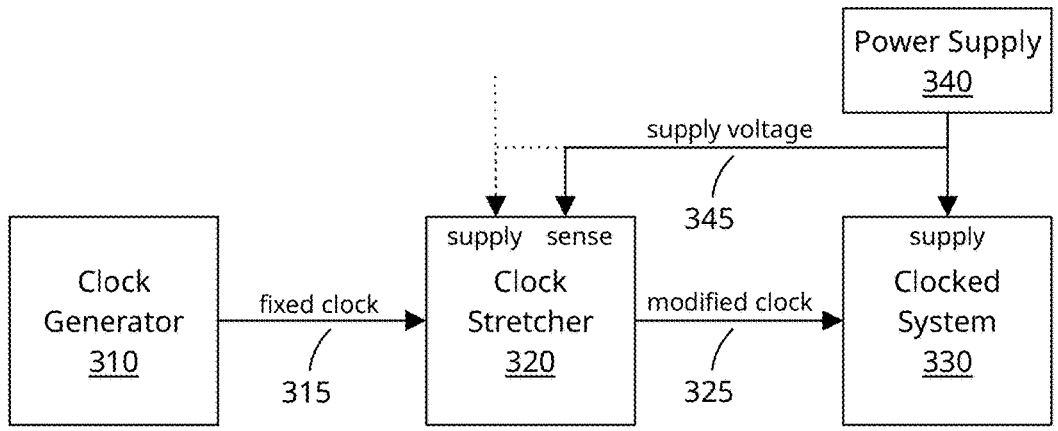
FIG. 3 illustrates an example system employing a clock stretcher according to an embodiment of the invention.

FIG. 3 illustrates an example system 300 employing a clock stretcher according to an embodiment of the invention. System 300 includes clock generator 310, clock stretcher 320, clocked system 330, and power supply 340. Clock generator 310 generates fixed clock 315 which it forwards to clock stretcher 320. Clock stretcher 320 senses supply voltage 345 and temporarily lowers the frequency of the clock during a period of heavy loading, resulting in modified clock 325 which it forwards to clocked system 330. Power supply 340, which delivers supply voltage 345, powers clocked system 330 and in some embodiments also clock stretcher 320. However, in other embodiments, clock stretcher 320 may receive its supply power from another source or it may include an intervening voltage regulator. The function of clock stretcher 320 is to sense how much supply voltage 345 drops below its nominal value, and lower the frequency of modified clock 325 accordingly to a value at which clocked system 330 can remain operating safely without experiencing timing violations and functional failures.

Clocked system 330 may be or include any digital or mixed-signal system that uses a clock signal for clocking synchronous digital logic circuits, and may include an IC, an SoC, an MCM, a PCB, or any other module that includes synchronous digital circuits. For example, clocked system 330 may include a chip with one or more processors, such as a CPU, GPU, or AI chip. Clock generator 310 may include as oscillator, such as a crystal oscillator, an LC oscillator, a ring oscillator, or any other oscillator; a frequency generator to take an oscillator output signal and generate a signal with another frequency, for example a much higher frequency; a buffer; and any other circuit to produce a fixed clock suitable for clocking clocked system 330. Power supply 340 may include a battery, a DC-to-DC converter, a voltage regulator, a current regulator, and any other circuit commonly used in the art to supply a clocked system with electric power. In some embodiments, a single semiconductor chip, MCM, or PCB may include one or more of clock generator 310, clock stretcher 320, clocked system 330, and/or power supply 340.

Figure 4:
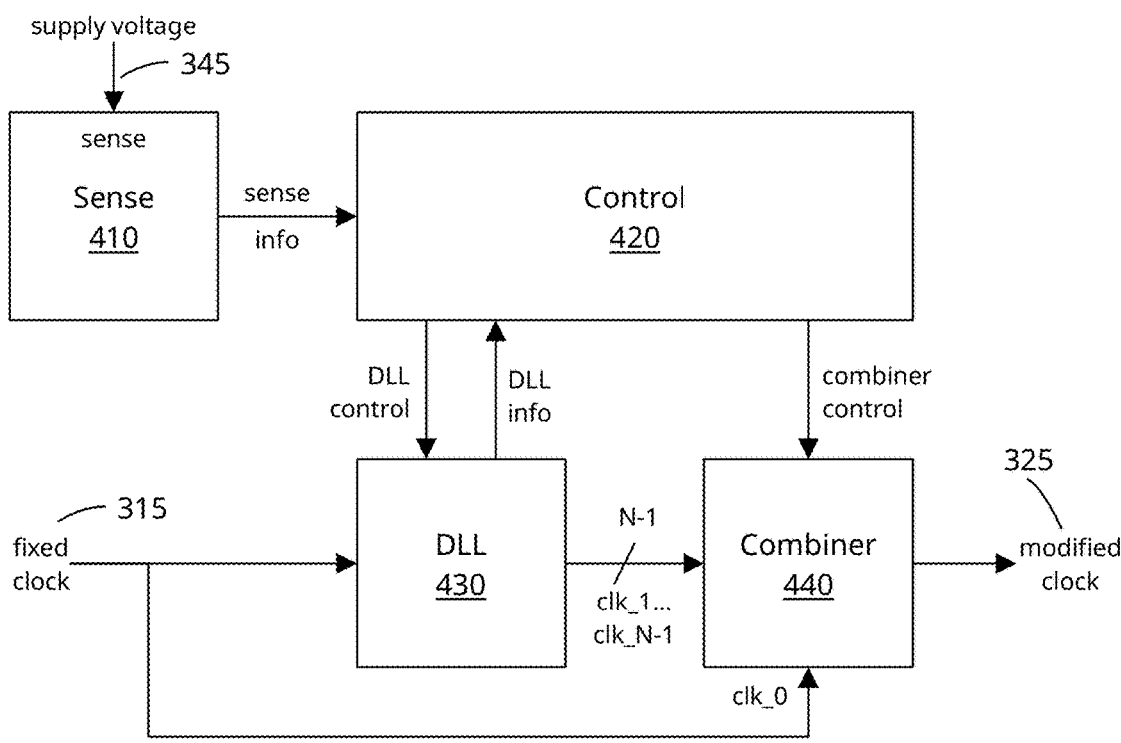
FIG. 4 illustrates example details of the clock stretcher according to an embodiment of the invention.

FIG. 4 illustrates example details of clock stretcher 320 according to an embodiment of the invention. Clock stretcher 320 includes sense unit 410, control unit 420, DLL 430, and combiner 440. Sense unit 410 is operable to receive supply voltage 345 at its sense input. It has one or more outputs that are coupled with control unit 420 to provide sense information. In general, sense unit 410 senses or measures the condition of one or more parameters to determine the sense information. The sense information may include information about the measured voltage (the supply voltage 345) of power supply 340. For example it may include a digitized amplitude of supply voltage 345, or it may include a signal indicating that supply voltage 345 has dropped below one or more preset thresholds, such as the thresholds related to $f_{max\_0.85}$, $f_{max\_0.80}$, $f_{max\_0.75}$, $f_{max\_0.70}$, and $f_{max\_0.65}$ of FIG. 2. In an embodiment, the sense information may include one or more enable signals, a mode enable signal that allows switching between a passive and a stretching mode, a required length N1 (i.e., a number of delay stages) that the embodiment should use to synchronize to fixed clock 315, and a hop code that, with the DLL length, determines the fraction that the clock is stretched. Control unit 420 uses the sense information, as well as DLL information received from DLL 430, to control both DLL 430 and combiner 440. The DLL information may include the DLL phase error, the EOC, and the timing and size of a DLL speed correction. In some embodiments, the DLL information may include parameters derived from those, passing only values that would give rise to pulse shortening, i.e. values relating to a glitch if uncompensated. Based on a sensed value of supply voltage 345, sense unit 410 or control unit 420 generates the hop code h, whose value control unit 420 uses for phase selection in combiner 440. DLL 430 receives fixed clock 315 at its input. It has a delay line with N delay stages, and at least N−1 outputs at which it provides N−1 progressively delayed versions (or equidistant "phases") of fixed clock 315. For example, a first delay stage output may provide an output signal clk_1 that equals fixed clock 315 delayed by a time Δt, a second delay stage output may provide an output signal clk_2 that equals fixed clock 315 delayed by 2Δt, and so on. The Nth delay stage produces a signal clk_N that equals fixed clock 315 delayed by NΔt. The delay line forwards clk_1 through clk_N−1 to combiner 440. The embodiment may use signal clk_N internally within DLL 430. Control unit 420 further generates the combiner control signals, which it passes to combiner 440, and which may include a bypass enable signal and one or more addresses of delay stage outputs to be coupled with the clock stretcher output that provides modified clock 325. The one or more addresses may include, for example, a binary number, or a 1-hot code.

To perform the functionalities described in this document, control unit 420 may include memories or registers to store the following parameters used for correcting various types of glitches: the offset skip value os, the minimum hop value mh, the code change hop value cch, the zero code stretch value zcs, the phase rollback wait value prw, and the bypass skip value bs.

DLL 430 may be configured (for example, by DLL control signals from control unit 420) to ensure that N times Δt equals one average clock cycle time of fixed clock 315. While the DLL is in lock, the phase of clk_N is shifted by 2π radians from the phase of fixed clock 315. DLL 430 provides at least N−1 phases clk_1 . . . clk_N−1 to combiner 440 which also receives fixed clock 315. The delay stage output signal clk_N may not be coupled to the combiner, as the embodiment may use the undelayed signal of fixed clock 315 in its place.

In embodiments, control unit 420 may also configure DLL 430 to lock the fixed clock 315 clock cycle time T to less than the delay of N delay stages, i.e. to less than N times Δt.

Combiner 440 receives the at least N−1 phases from DLL 430 as well as fixed clock 315. Controlled by combiner control signals from control unit 420, combiner 440 passes fixed clock 315 at times when the clock does not need to be slowed down, and it cycles through the phases clk_0 (which equals fixed clock 315) and clk_1 . . . clk_N−1 when the clock needs to be slowed down, as further detailed in FIGS. 12-13. Some of the time, combiner 440 may create modified clock 325 from combining phases clk_0 . . . clk_N−1 as discussed below, and at other times it may pass clk_0 to the output as modified clock 325.

Some embodiments may power DLL 430 from a power supply that is separately regulated from supply voltage 345. Other embodiments power DLL 430 from supply voltage 345 without intervening voltage regulation.

Figure 5:
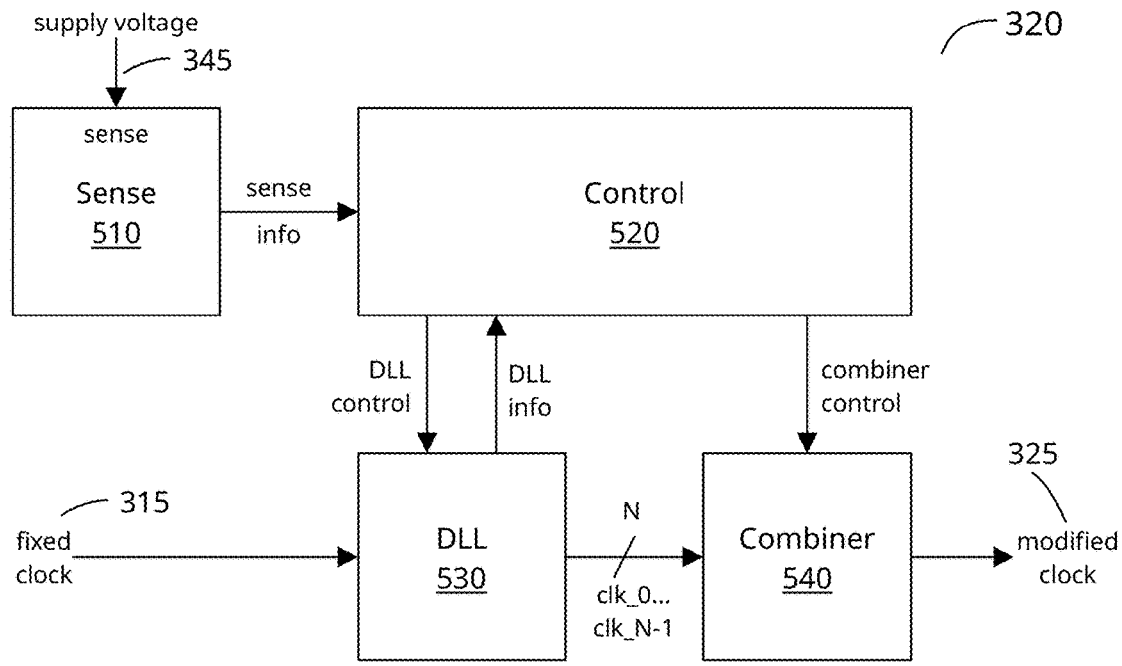
FIG. 5 illustrates details on another example clock stretcher embodiment.

FIG. 5 illustrates details on another example clock stretcher 320 embodiment. This embodiment includes sense unit 510, control unit 520, DLL 530, and combiner 540. Its functionality is largely the same as in FIG. 4, however, there is no direct connection between the fixed clock 315 input and combiner 540. Sense unit 510 has the same functionality as sense unit 410, control unit 520 has the same functionality as control unit 420, and DLL 530 has the same functionality as DLL 430. However, DLL 530 forwards at least N phases (instead of at least N−1 phases) to combiner 540. The number of delay stages in DLL 530 is at least N+1, and DLL 530 synchronizes the delay between a first and a last of the at least N+1 delay stages to the fixed clock 315 clock cycle time T. DLL 530 may include one or more initial delay stages before the first of the N+1 stages, providing a delay offset for all forwarded phases. Those initial delay stages may help to reduce jitter. Combiner 540 uses the first of the forwarded N phases (clk_0) as the "undelayed" signal, i.e., similar to how the embodiment in FIG. 4 uses fixed clock 315.

Some embodiments may power DLL 530 from a power supply that is separately regulated from supply voltage 345. Other embodiments power DLL 530 from supply voltage 345 without intervening voltage regulation. Further embodiments provide a bypass for fixed clock 315 to modified clock 325, so that when no clock stretching is needed, they can bypass DLL 530 and combiner 540 to save power and reduce jitter.

Figure 6:
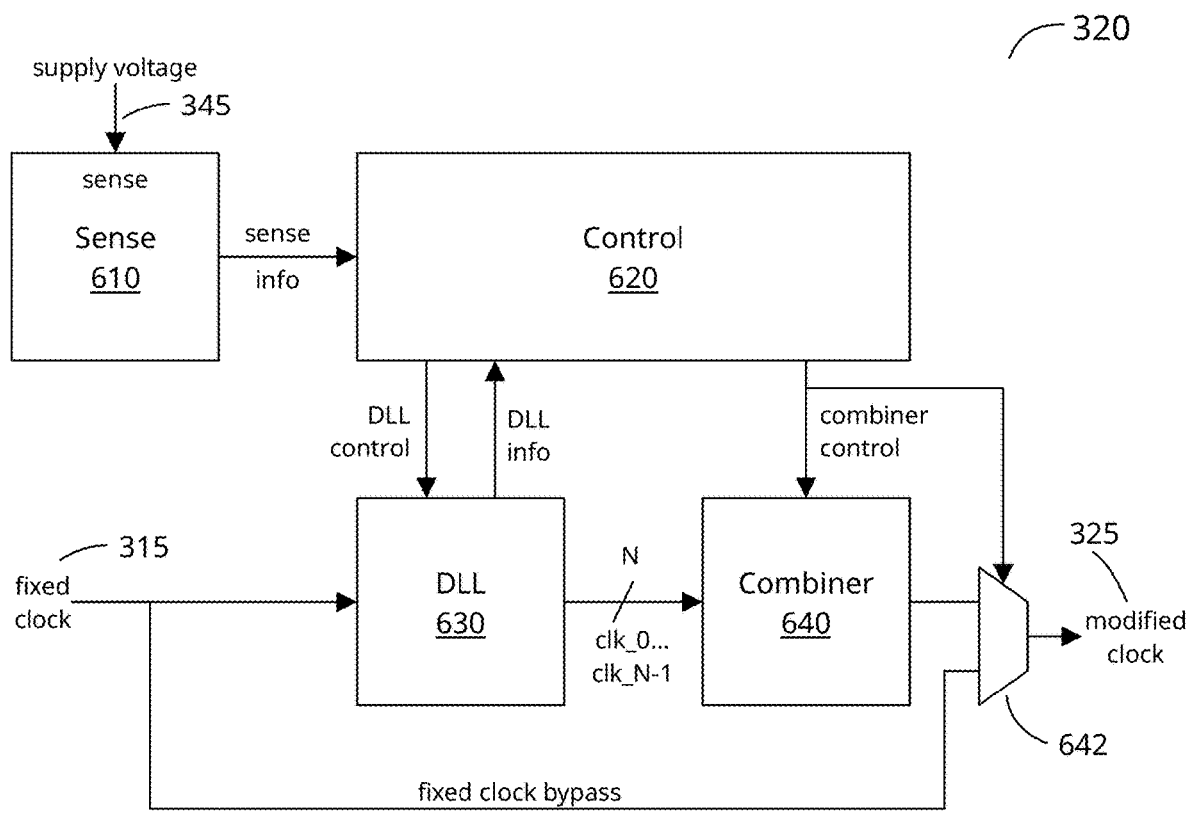
FIG. 6 illustrates details of an example clock stretcher with a full fixed clock bypass according to an embodiment of the invention.

FIG. 6 illustrates details of an example clock stretcher 320 with full fixed clock bypass according to an embodiment of the invention. This embodiment includes sense unit 610, control unit 620, DLL 630, combiner 640, and bypass multiplexer 642. Again, the functionality of sense unit 610, control unit 620, and DLL 630 is the same as the functionality of sense unit 410, control unit 420, and DLL 430. This embodiment combines advantages of the embodiments in FIG. 4 and FIG. 5, and it allows fully bypassing DLL 630 and combiner 640 when in passive mode, i.e., when no stretching occurs. The bypass allows placing DLL 630 and combiner 640 in a power saving mode when they are not operational, and it also reduces jitter in modified clock 325. DLL 630 passes N phases clk_0 . . . clk_N−1 to combiner 640, which allows for some offset between fixed clock 315 and clk_0 from some initial delay line stages that may be used to reduce delay line jitter. FIG. 6 shows bypass multiplexer 642 as separate from combiner 640, however, some embodiments may incorporate bypass multiplexer 642 within combiner 640. Also, some embodiments implement bypass multiplexer 642 with combinatorial logic only, and other embodiments implement bypass multiplexer 642 with pass gates.

Figure 7:
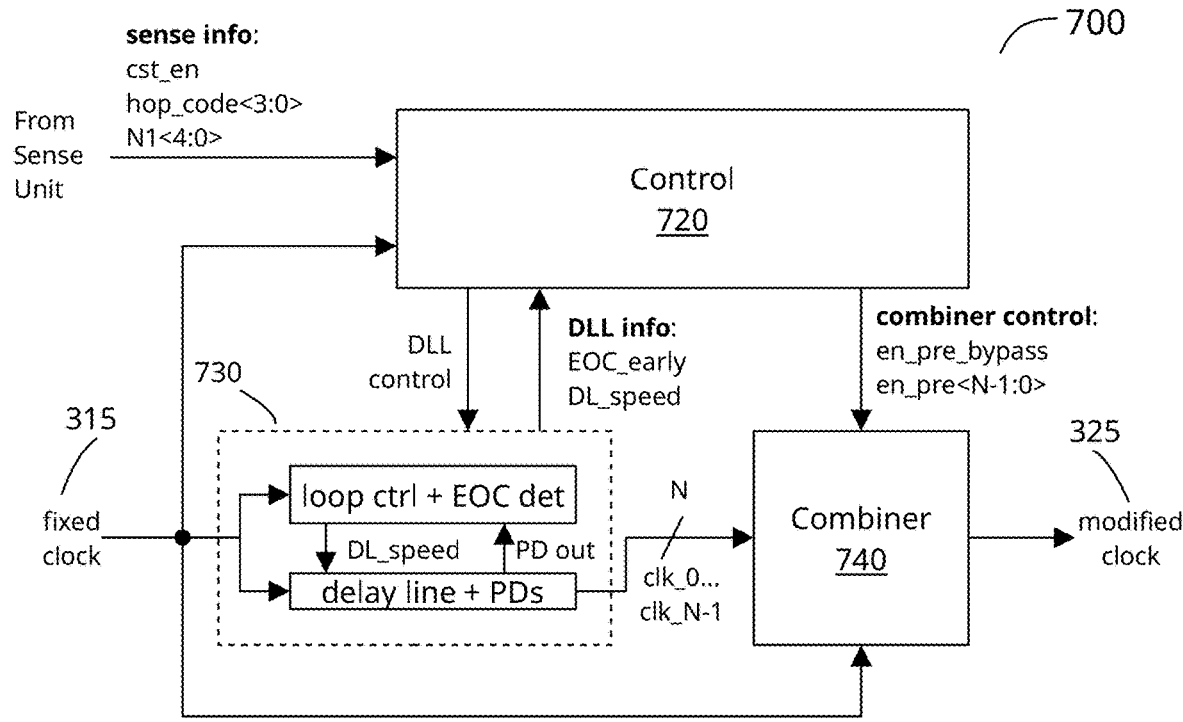
FIG. 7 illustrates details of a clock stretcher implementation according to an embodiment of the invention.

FIG. 7 illustrates details of a clock stretcher 700 implementation according to an embodiment of the invention. Clock stretcher 700 includes control unit 720, DLL 730, and combiner 740. The sense unit has not been drawn. The sense unit provides control unit 720 with sense information, including cst_en, a 4-bit hop code hop_code<3:0>, and a 5-bit required length N1<4:0>. Control unit 720 receives DLL information from DLL 730, including the signals EOC_Early (explained with reference to FIG. 14) and the delay line speed control signal (explained with reference to FIG. 9 and FIG. 10) DL_speed. Based on the sense information and the DLL information, control unit 720 generates combiner control information, including the signals en_pre_bypass, which enables bypassing DLL 730 in passive mode, and en_pre<N−1:0>, which provides a 1-hot encoded phase selection address for combiner 740. DLL 730 includes a delay line with a series of phase detectors. The delay line's speed is controlled by the DL_speed signal. The phase detector outputs are coupled with an end-of-chain (EOC) detector, which may be integrated with the DLL loop control circuitry. The DLL loop control circuitry uses the EOC information to calculate a phase error, the EOC_early signal, and the DL_speed signal as will be detailed in later figures. Combiner 740 takes fixed clock 315_ and clk_0 . . . clk_N−1 as clock inputs for combining. When en_pre_bypass is active, clock stretcher 700 passes fixed clock 315 as modified clock 325. In other cases, when en_pre<m> is active, combiner 740 passes clk_m as modified clock 325.

Figure 8:
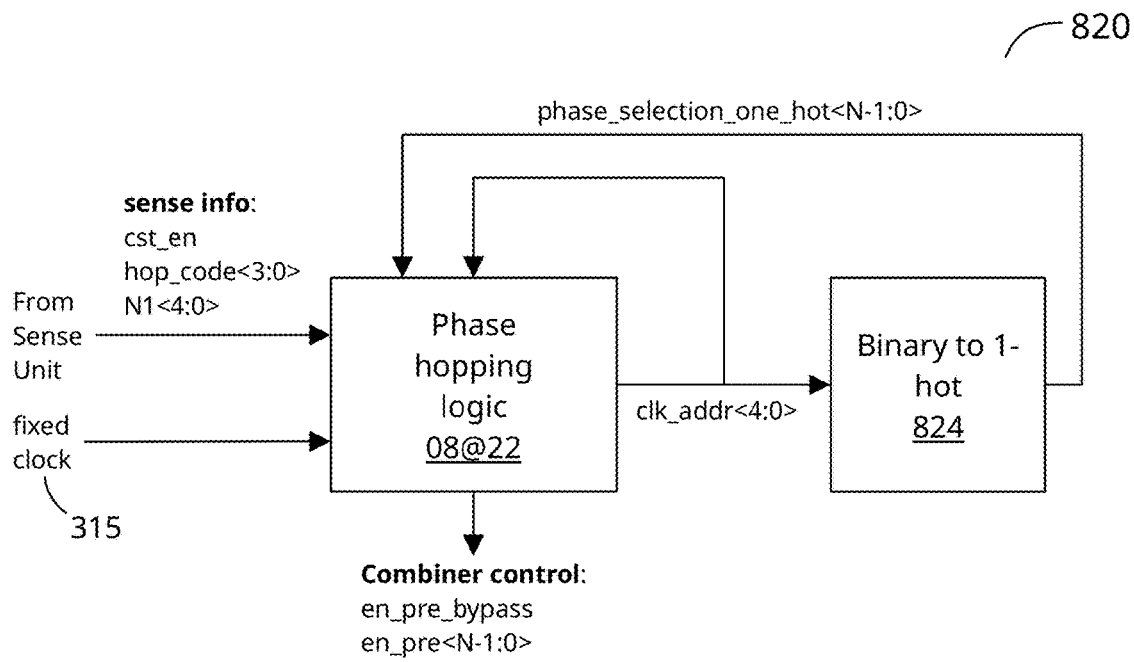
FIG. 8 illustrates details of a control unit implementation according to an embodiment of the invention.

FIG. 8 illustrates details of a control unit 820 implementation according to an embodiment of the invention. Control unit 820 includes phase hopping logic 822 and binary to 1-hot encoder 824. Phase hopping logic 822 receives the sense information, including cst_en, hop_code<3:0> and N1<4:0>, and generates the combiner control information, including en_pre_bypass and en_pre<N−1:0>. It also generates the combiner address clk_addr<4:0>. Binary to 1-hot encoder 824 takes the combiner address and decodes it into phase_selection_one_hot<N−1:0>, which is returned to phase hopping logic 822 and used to generate en_pre<N−1:0>.

Figure 9:
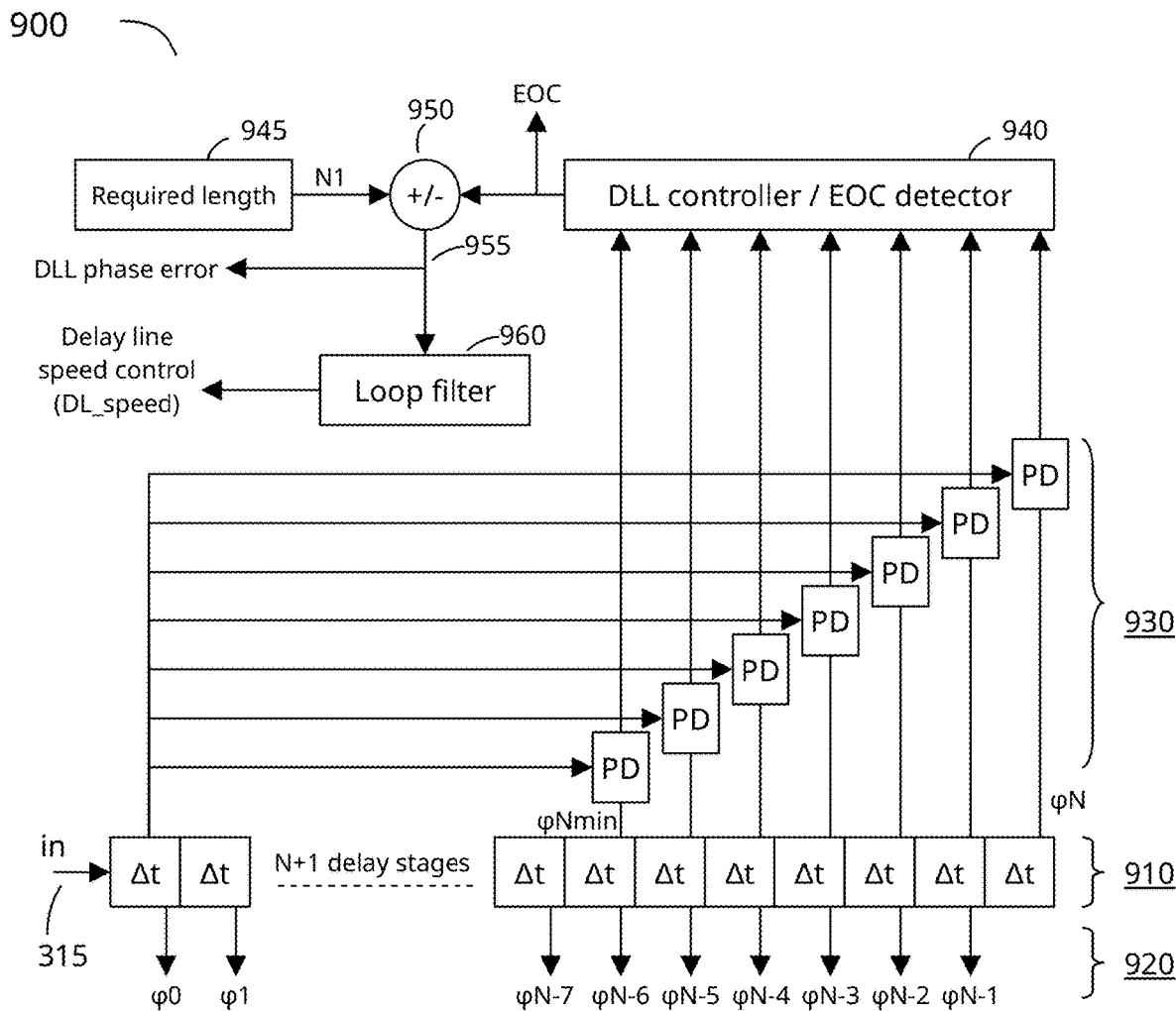
FIG. 9 illustrates a first example DLL for a clock stretcher according to an embodiment of the invention.

FIG. 9 illustrates a first example DLL 900 for a clock stretcher according to an embodiment of the invention. DLL 900 includes at least N+1 delay stages of delay line 910, with phase outputs 920 (φ0 . . . φN, also denoted here as clk_0 . . . clk_N), up to N phase detectors 930, and DLL controller 940. It further includes required length interface 945 (which may include a memory or a register), phase comparator 950, and loop filter 960. An input signal (fixed clock 315) travels through the delay stages of delay line 910 and is first visible as clk_0 (or φ0) at the initial delay line output and last visible as clk_N (or φN) at the final delay line output. At least a part of the delay line output signals is forwarded to phase detectors 930. Seven phase detectors 930 are drawn, coupled to successive delay stages, but an embodiment may have any number of phase detectors 930 from 1 to N. Phase detectors 930 may be coupled to successive delay stages going backwards from the final delay stage towards the initial delay stage, or an embodiment may skip some delay stages.

DLL controller 940 selects an output signal of one of the phase detectors 930 and measures or calculates the EOC in an EOC detector. The EOC stands for the detected number of stages through which one clock cycle T of fixed clock 315 travels. Phase comparator 950 compares the EOC with the required length N1 from required length interface 945 and forwards their difference, DLL phase error 955, to loop filter 960, which may include an integrator and other filter functions. Loop filter 960 outputs the delay line speed control value, which the embodiment uses to control the delay line speed, thus forming a negative feedback loop. The delay line speed may be defined as the number of delay stages through which one pulse of fixed clock 315 travels, divided by the clock period T of the fixed clock 315 pulse. The negative feedback loop locks the delay of N1 delay stages to the clock cycle T of fixed clock 315. Thus, when in lock, the nominal delay line speed equals N1 delay stages divided by a clock period T of the input clock signal. The instantaneous delay line speed may deviate, and equal EOC delay stages divided by a clock period T of the input clock signal. DLL 900 may control the speed of delay line 910 based on the delay line speed control value in any way known in the art, including by using a digitally tunable capacitor bank or by using current pinching. DLL controller 940 may determine EOC for every cycle of fixed clock 315 to allow for an immediate response to changes in the power supplied to DLL 900. Although required length interface 945, phase comparator 950, and loop filter 960 may operate at the frequency of fixed clock 315, in some embodiments they operate at a lower frequency, for example at between half and a sixteenth of the frequency of fixed clock 315.

As described with reference to FIG. 4, DLL 900 generates the DLL information for control unit 420, control unit 520, or control unit 620. DLL 900 may directly include the EOC, the DLL phase error, and/or the delay line speed control into the DLL information, and leave the respective control unit with extracting information relevant to clock stretcher glitches, or DLL 900 may do so for the control unit. For example, if delay line 910 is slow due to a drop in the DLL supply voltage, the EOC will be lower than the required length N1 and the DLL phase error will be positive. A positive phase error will give a glitch, so some embodiments may derive an EOC_Early parameter that equals the DLL phase error for positive values, and that is zero otherwise. Some embodiments may include EOC_Early in the DLL information, whereas other embodiments may include the DLL phase error, or the EOC. Similarly, some embodiments may include the delay line speed control value, whereas other embodiments may include a derived Boolean parameter that indicates whether the delay line speed control value equals zero or not.

Figure 10:
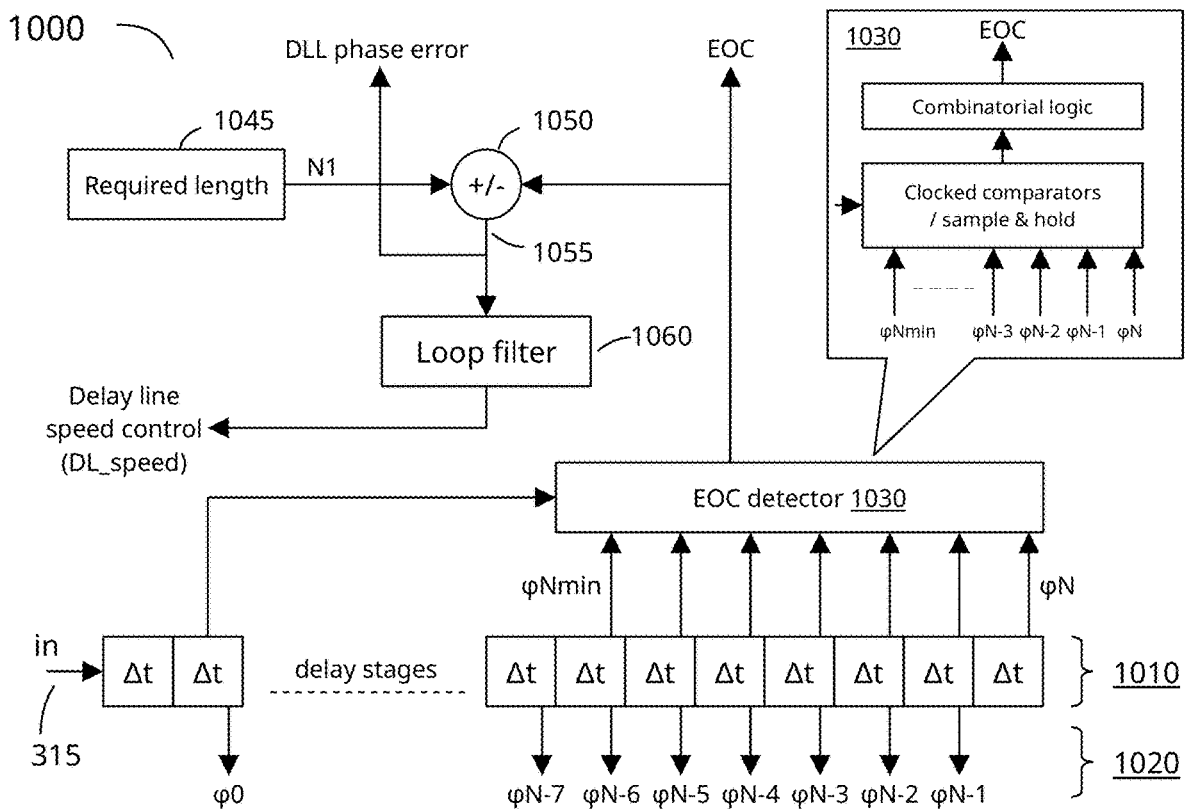
FIG. 10 illustrates a second example DLL for a clock stretcher according to an embodiment of the invention.

FIG. 10 illustrates a second example DLL 1000 for a clock stretcher according to an embodiment of the invention. It synchronizes the fixed clock 315 clock pulse cycle time T to a required actively used length of its delay line delay. DLL 1000 comprises a delay line including at least N+1 delay stages 1010, phase outputs 1020, EOC detector 1030, required length interface 1045, phase subtractor 1050 and loop filter 1060. DLL 1000 receives fixed clock 315 at the start of the delay line, and makes the input clock pulses travel through delay stages 1010. A series of N successive delay stages are coupled to phase outputs 1020 to provide equidistant phase signals (φ0 . . . φN−1, i.e., clk_0 . . . clk_N−1) for combiner 440, combiner 540 or combiner 640. The series of N successive delay stages may be preceded by zero or more (e.g., up to ten) additional delay stages, providing an offset delay to all phase outputs 1020, and potentially lowering phase jitter. The series of N successive delay stages is followed by at least one delay stage that internally delivers φN (clk_N), and may be followed by additional dummy stages to further reduce jitter. EOC detector 1030 receives phase signals φNmin . . . φN (where Nmin determines the shortest effective length that the delay line may have and N determines the longest effective length that the delay line may have), and EOC detector 1030 is clocked by phase φ0. Upon receiving a positive edge from φ0, EOC detector 1030 detects a positive edge from among the phases φNmin . . . φN (in some embodiments, upon receiving a negative edge from φ0, it detects a negative edge), and forwards the resulting phase number to phase subtractor 1050, which subtracts it from the number N1 at required length interface 1045. When a fixed clock 315 clock pulse with clock cycle time T travels through the delay line, upon receiving the start of a clock pulse at phase φ0, EOC detector 1030 detects the start of the previous clock pulse between φNmin and φN, and determines its phase number. The phase number represents the number of delay stages through which the previous clock pulse has traveled, i.e., the number of delay stages that delays the fixed clock 315 by one clock period T. When the DLL is in lock, this number (on the average) equals the required length N1 at required length interface 1045, and the average difference (DLL phase error 1055) equals zero. However, the instantaneous DLL phase error 1055 may be unequal to zero when a supply voltage drop occurs. The difference is passed on to loop filter 1060, whose output is used to adjust the delay line speed, for example by reducing or increasing supply current available to the delay stages. A change in delay line speed will result in a different number of delay stages through which the fixed clock 315 clock pulses travel, and because of the negative feedback this number will lock to the required length. An embodiment may implement EOC detector 1030 in many ways. It may comprise clocked comparators coupled with combinatorial logic (as shown), sample and hold circuits coupled with combinatorial logic, comparators, sample gates, a thermometer-to-binary converter, a thermometer-to-gray converter, or any other circuits known in the art to detect where in a chain of delay stages a signal transition occurs.

The DLL in FIG. 9 has been drawn with an offset of one Δt between fixed clock 315 and φ0 (clk_0). The DLL in FIG. 10 has been drawn with an offset of 2Δt. The DLLs receive their input clock pulses from fixed clock 315. In general, an embodiment may have an offset of a few delay stages, for example up to ten delay stages, or 10Δt. In those cases, the first of the N equidistant phases generated by the delay line, i.e. φ0 or clk_0, is or equals a delayed version of input clock pulses traveling through the delay line. An embodiment may also have no offset, i.e., the first of the N equidistant phases is not generated by the delay line, but it equals the input signal—an undelayed version of input clock pulses traveling through the delay line. As later described with reference to FIG. 18, the DLL phase comparator and loop filter may operate at a slower speed than fixed clock 315. For example, in case of a digital PLL, the phase comparator and loop filter may operate at a DLL internal clock frequency that is lower than the frequency of fixed clock 315, even though phase detectors 930 or EOC detector 1030 may be clocked at the same frequency as fixed clock 315 and provide the EOC signal for each pulse in fixed clock 315.

Figure 11:
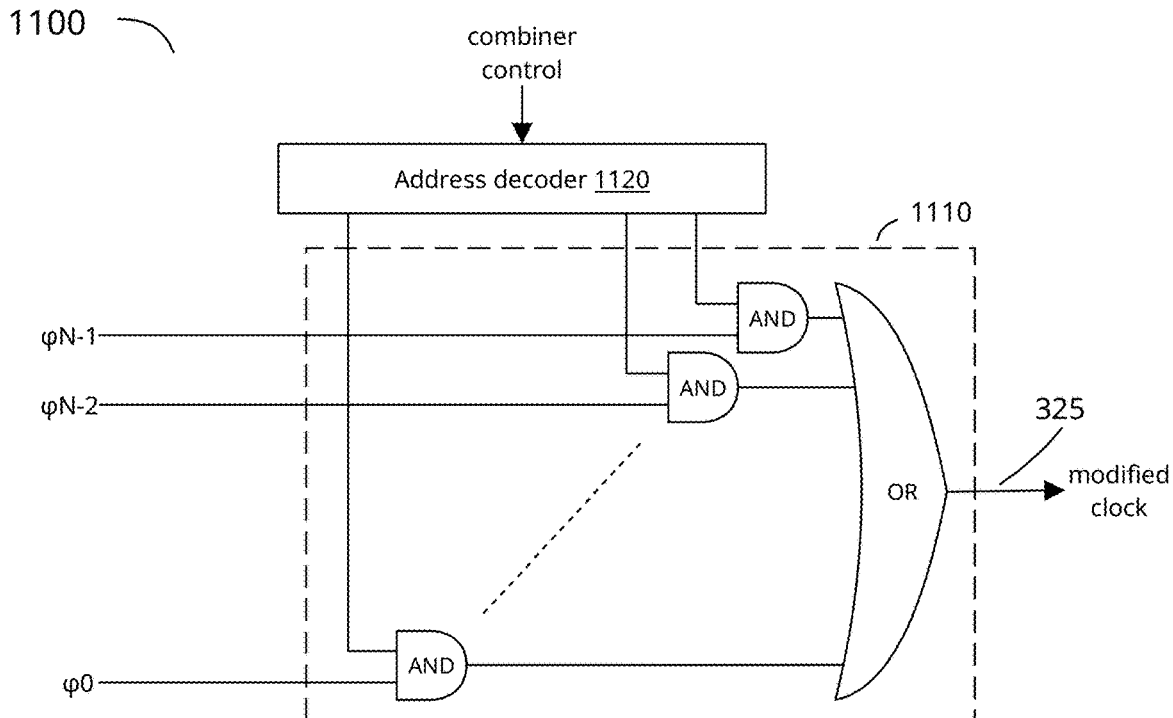
FIG. 11 illustrates a basic combiner according to an embodiment of the invention.
Figure 12:
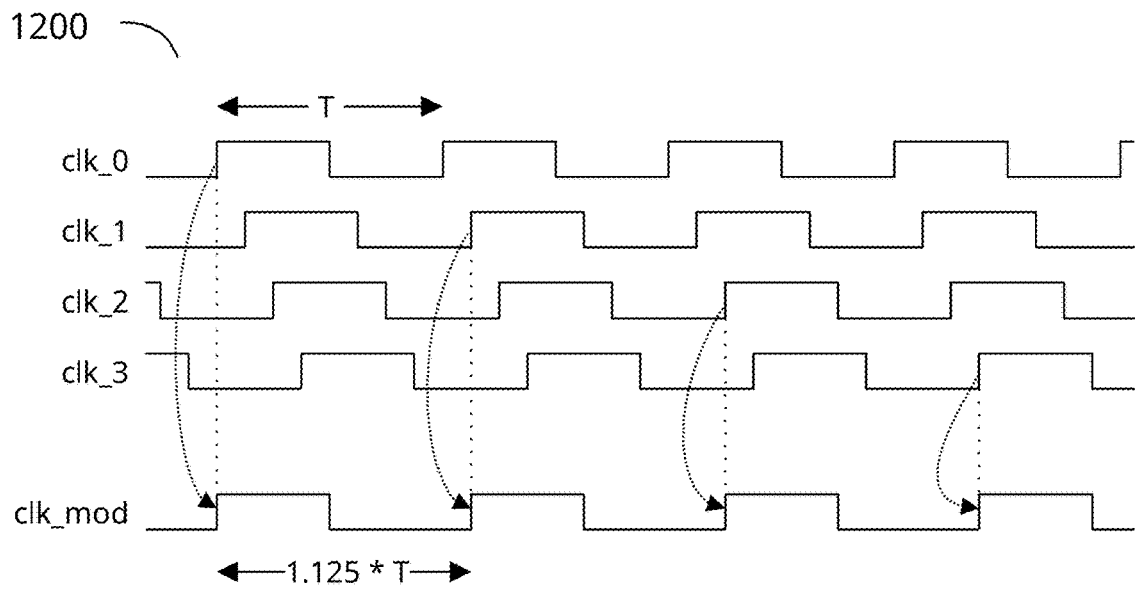
FIG. 12 illustrates a first example of slowing down a clock according to an embodiment of the invention.
Figure 13:
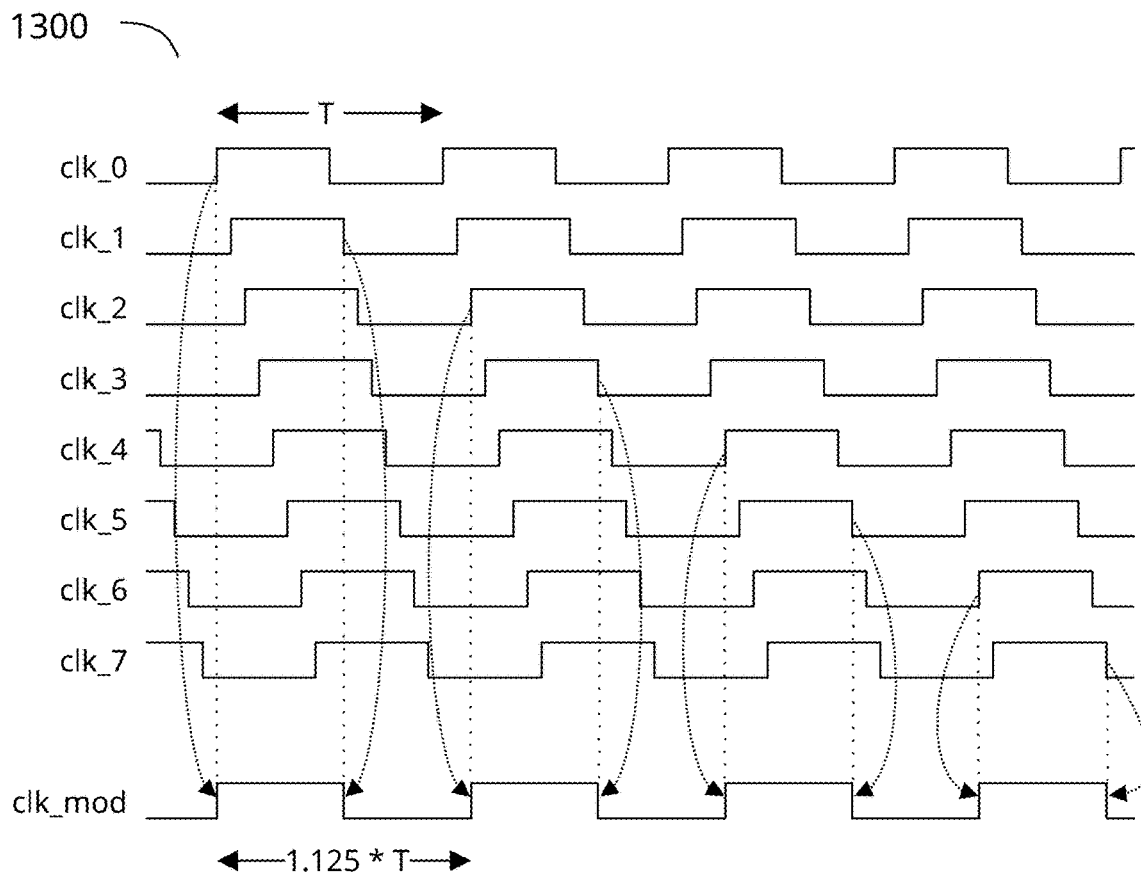
FIG. 13 illustrates a second example of slowing down a clock according to an embodiment of the invention.

FIG. 11 illustrates a basic combiner 1100 according to an embodiment of the invention. Combiner 1100 includes combinatorial logic 1110 and address decoder 1120. Some embodiments may comprise additional circuits, such as signal retimers, and bypass logic. Address decoder 1120 receives combiner control signals from control unit 420 or control unit 520, including information regarding which of the phase signals φ0 . . . φN−1 to forward to the clock stretcher output for modified clock 325. Address decoder 1120 may include a binary-to-1-hot encoder that takes the address information and outputs one line per phase, where the line for the ith phase φi is high when phase φi must be forwarded to modified clock 325, and low at all other times. Combinatorial logic 1110 uses the decoded address information to forward the appropriate phases. The logic shown to accomplish this is simple, using N 2-input AND gates and one N-input OR gate. However, embodiments may use any combinatorial logic to achieve this functionality. For example, a silicon compiler generating a netlist for standard CMOS logic implementation is likely to use mainly NAND and NOR gates with 2 or 4 inputs. FIG. 12 below illustrates that some embodiments forward one phase at a time to modified clock 325, and FIG. 13 illustrates that other embodiments may forward two phases at a time to modified clock 325. In general, an embodiment may forward one or more phases at a time to modified clock 325.

A clock stretcher stretches a clock, and lowers its frequency, by regularly removing a clock pulse, and repositioning (retiming) the remaining clock pulses so that they appear at regular intervals. For example, if the delay line has an effective length N1=24 and the hop code h equals 2, then the clock stretcher skips 2 out of every 24 clock pulses and repositions the remaining 22 clock pulses, so that the modified clock 325 has 22 clock pulses for every 24 clock pulses of fixed clock 315. FIG. 12 will illustrate how an embodiment does this. FIG. 13 will illustrate how an embodiment may also correct the length of the pulses, so that pulses and spaces in between retain a duty cycle of 50%. The same principles can also be used for squeezing a clock and increasing its frequency. An embodiment may regularly insert (i.e., repeat) a clock pulse, and reposition (retime) surrounding clock pulses to make room for it and to make the clock pulses appear at regular intervals.

For a repetitive signal, a phase of an occurrence of a pulse is not visibly distinct from the phase of the occurrence of the prior pulse, but it is shifted by $2\pi$ radians or 360 degrees. The phase of the later pulse could be simulated from the earlier pulse by increasing it by $2\pi$ radians, i.e., shifting it one occurrence. By cyclically shifting pulses with a fraction of $2\pi$ radians, their frequency can be altered. An embodiment shifts pulses by generating a number of equidistant delayed versions, spread out over $2\pi$ radians, i.e. over one clock cycle. It then cyclically selects from among these equidistant phases to generate the modified clock. If an input clock cycle corresponds with the delay of N1 delay stages outputting N1 equidistant phases, then slower or faster clocks can be generated in increments of 1/N1. If a signal travels from the left to the right through N1 equidistant delay stages, then the embodiment can decrease the frequency by 1/N1 by, for successive clock pulses, selecting phases from the left to the right, one step (or hop) at a time. It can decrease the frequency by 2/N1 by going two steps at a time, etc. It can increase the frequency by 1/N1 by selecting phases from the right to the left, one step at a time, etc. When phase selection comes to the end (or the beginning) of the delay stages, the embodiment has completed a cycle, and phase selection must wrap around—go to the beginning, or go to the end, respectively. Various conditions described in this document can result in clock pulse shortening when clock pulse stretching is required. Control unit 420, control unit 520, or control unit 620 evaluates these conditions, and stretches the clock pulses by increasing the hop code h as described with reference to the following figures.

FIG. 12 illustrates a first example 1200 of slowing down a clock according to an embodiment of the invention. First example 1200 shows four consecutive phases clk_0 through clk_3, with phase delays of $2\pi/8$ radians, or one eighth clock cycle T/8. Combiner 440 may create modified clock clk_mod from clk_0 ... clk_3 by first passing clk_0, then in the next clock cycle passing clk_1, in the following clock cycle passing clk_2, etc. After passing clk_7 (not drawn), combiner 440 or combiner 540 starts over and passes clk_0. By cyclically passing consecutive phases of an input clock that are shifted T/8 in time, combiner 440 or combiner 540 creates a modified clock clk_mod whose cycle has a duration of 1.125*T, i.e. its frequency is one eighth lower than the frequency of each of the input phases clk_0 ... clk7.

In a similar fashion, combiner 440 or combiner 540 may modify the clock frequency by two eights by each time skipping one phase. This means that it consecutively passes clk_0, clk_2, clk_4, clk_6, clk_0, etc. It may slow down the clock by three eights by each time skipping two phases. That means that it consecutively passes clk_0, clk_3, clk_6, clk_2, clk_5, clk_0, etc. Thus, for a delay line of length N, combiner 440 or combiner 540 can output clocks with N different frequencies. The highest frequency is when no hopping occurs, i.e. it continuously passes clk_0 or any of the other phases to its output. In this case, the output clock has the same frequency as the input clock. The lowest frequency is when maximum hopping occurs, i.e. N−1 hops (or N−2 skips). In that case, the output frequency equals N/(2N−1) times the input frequency.

It should be noted that the method in FIG. 12 yields a modified frequency whose duty cycle is unequal to 50%. The method does not stretch the pulses, but the time in between pulses. For some clocked systems this may be acceptable, but other clocked systems may require a duty cycle close to 50%. For those cases, an embodiment may use the method shown in FIG. 13.

FIG. 13 illustrates a second example 1300 of slowing down a clock according to an embodiment of the invention. Second example 1300 shows 8 out of 16 consecutive phases that are each one-sixteenth clock cycle apart (N=16). In this embodiment, combiner 440 or combiner 540 combines two phases for each pulse of the modified clock clk_mod. For example, as illustrated, combiner 440 or combiner 540 creates a modified clock whose frequency is one-eighth lower than the input frequency, and whose duty cycle (theoretically) equals 50%. To create the first pulse of clk_mod, combiner 440 or combiner 540 passes clk_0 plus clk_1 to clk_mod, i.e. clk_mod=clk_0 OR clk_1. To create the second pulse of clk_mod, combiner 440 or combiner 540 passes clk_2 plus clk_3, i.e. clk_mod=clk_2 OR clk_3, etc.

As can be readily understood, an embodiment may use the method in FIG. 13 to create lower modified frequencies by skipping (hopping) in a similar fashion as discussed with reference to FIG. 12. Since there are N possible different hop codes, and the method uses two overlapping phases to create one pulse of the modified clock, it can (theoretically) create N/2 different frequencies with 50% duty cycle (including the full-frequency signal). Additionally, it allows creation of another N/2 frequencies with near-equal duty cycle.

Clock Stretcher with Increased Input Frequency Range

It was shown above that combiner 440, combiner 540, and combiner 640 have an output frequency range of roughly one octave. The highest output frequency equals the input frequency (of fixed clock 315), and theoretically the lowest output frequency equals N/(2N−1) times the input frequency, which for a large value of N approaches half the input frequency.

The input frequency range of a conventional clock stretcher is much narrower than the output frequency range. This is because the DLL's delay line is typically created from a chain of logic gates, for example a chain of inverters or NAND gates. Although the gate delay can be controlled using a digitally-controlled capacitor or a digitally-controlled resistor, the control range is limited, and therefore a DLL with a fixed number of N stages can handle a small range of clock frequencies. Based on a gate delay that can be varied between Δtmin and Δtmax, the N stages give a total delay between Tmin=N*Δtmin and Tmax=N*Δtmax.

Embodiments increase the range of possible input frequencies by making the number of input stages variable. This can be achieved with each of the DLLs in FIGS. 9-10. Whereas a conventional DLL compares the first or input phase with the last phase, a DLL in an embodiment calculates EOC and compares it with the required length N1 to obtain the DLL phase error. By choosing an N1 value that is appropriate for the fixed clock 315 frequency, the DLL can lock the delay line to a much larger range of input frequencies than is possible with conventional clock stretchers. By determining EOC at each occurrence of a fixed clock 315 clock cycle, an embodiment allows for changing the fixed clock 315 frequency in runtime.

Clock Stretcher with Correction for Glitches Due to Finite DLL Bandwidth

A DLL synchronizes its delay speed to the fixed clock 315 clock cycle time T using a negative feedback loop. The loop includes a loop filter with limited bandwidth to ensure stability. The limited bandwidth results in corrections not being instantaneous. If the clock stretcher receives its own power supply from power supply 340 and the supply voltage 345 suddenly droops, the delay line may become slower, and it may take the negative feedback loop some time to correct this slowdown. The DLL receives a required length N1 in runtime, and locks the delay of N1 delay stages to the fixed clock 315 clock cycle time T. For any one fixed clock 315 clock pulse traveling through the delay line the DLL measures or determines the instantaneous EOC, i.e., the number of delay stages through which one clock cycle T of fixed clock 315 travels.

A delay line with Nmax stages, that synchronizes the fixed clock 315 clock cycle time T to N1 stages (where N1<Nmax), may slow down during a droop and the fixed clock 315 clock cycle T may travel through only EOC stages instead of N1 stages (EOC<N1). When phase selection wraparound occurs, the modified clock goes from a pulse that is (too much) delayed to a pulse that is undelayed or correctly delayed. Thus, the time between the pulse before wraparound and the pulse after wraparound is too short, which jeopardizes the functionality of clocked system 330.

A first embodiment detects the slowdown (the phase error, i.e., N1−EOC), and adds it to the hop size when a phase selection wraparound occurs. In an example, the DLL has a hop code (i.e., phase selection step size for successive modified clock pulses) of 1 and synchronizes T to a required length of N1=28 stages. If during a droop the delay line slows down so that the clock cycle T covers EOC=25 stages, then there is a phase error of 3 stages. Instead of selecting clk_0 after clk_N1−1, the embodiment selects clk_3 after clk_N1−1.

A second embodiment detects the slowdown and determines EOC. Instead of wrapping its phase selection around at N1 stages, it wraps around at EOC stages.

FIG. 14 illustrates a first method 1400 to correct glitches due to finite DLL bandwidth in a clock stretcher according to an embodiment of the invention. The clock stretcher may have a general architecture such as clock stretcher 320 in FIG. 5. Method 1400 includes the following steps.

Step 1410—receiving input clock pulses with a fixed frequency and a clock cycle time T, and delaying the input clock pulses in a delay line including delay stages in a DLL. The delay line may have more than N1 stages, and the embodiment may select N1 as a suitable delay line length for the fixed frequency of the input clock. The clock pulses may come from a clock generator, for example clock generator 310, or any other source of clock pulses.

Step 1420—in the DLL, locking a delay of N1 delay stages to clock cycle time T and forwarding at least N1 phases of the delayed input clock to a combiner. In the combiner, selecting the first of the N1 phases (clk_0) and forwarding it to the clock stretcher output as the modified clock. Initializing a previously selected phase p as 0. Thus, p=0.

Step 1430—determining an EOC_Early signal eoce. The embodiment may first determine the EOC, and calculate the phase error by subtracting EOC from the required length N1. The EOC_Early signal eoce equals the phase error (DLL phase error 955 or DLL phase error 1055) when the phase error is positive, and equals zero otherwise.

Step 1440—for a current input clock pulse, calculating a phase c of the delayed input clock based on a previously selected phase p and a hop code h by adding the hop code h to the previously selected phase p. Thus, c=p+h.

Step 1450—determining if phase selection wraparound must occur by determining if c+eoce exceeds N1-1 (the last of the N1 equidistant phases). The embodiment selects phases from clk_0 to clk_N1−1, so after phase clk_N1−1 it must wrap around and start at the beginning.

Step 1460—upon determining that phase selection wraparound must occur, adding the EOC_Early signal eoce to obtain the sum of c and eoce, and applying modulo N1 on the sum. Thus, c=(c+eoce) mod N1. This step means that, when the combiner wraps around, the embodiment adds the EOC_Early signal eoce to the hop code.

Step 1470—in the combiner, selecting phase c (e.g., clk_c) and forwarding it to the clock stretcher output as the modified clock.

Step 1480—updating the previously selected phase p as c. Thus, p=c. When a next input clock pulse arrives, to the clock stretcher continues with Step 1430.

Method 1400 is based on the clock stretcher architecture of FIG. 5. However, an embodiment with small changes can be applied to the architecture of FIG. 4, using fixed clock 315 for phase clk_0. Also, method 1400 is based on forwarding clk_0 . . . clk_N−1 to the combiner, whereas another embodiment may be based on forwarding clk_1 . . . clk_N to the combiner. Any such variations are within the ambit and scope of the present invention.

FIG. 15 illustrates a second method 1500 to correct glitches due to finite DLL bandwidth in a clock stretcher according to an embodiment of the invention. The clock stretcher may have a general architecture as clock stretcher 320 in FIG. 5. Method 1500 includes the following steps.

Step 1510—receiving input clock pulses with a fixed frequency and a clock cycle time T, and delaying the input clock pulses in a delay line including delay stages in a DLL. The delay line may have more than N1 stages, and the embodiment may select N1 as a suitable delay line length for the fixed frequency of the input clock. The clock pulses may come from a clock generator, for example clock generator 310, or any other source of clock pulses.

Step 1520—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified clock. Initializing a previously selected phase p as 0. Thus, p=0.

Step 1530—measuring a DLL phase error e and determining the number of delay stages EOC that span the current clock cycle time T.

Step 1540—for a current input clock pulse, calculating a phase c of the delayed input clock based on a previously selected phase p and a hope code h by adding the hop code h to the previously selected phase p and applying modulus EOC on the result if EOC<N1, or applying modulus N1 on the result otherwise. Thus, c=(p+h) mod min(EOC, N1).

Step 1570—in the combiner, selecting phase c (e.g., clk_c) and forwarding it to the clock stretcher output as the modified clock.

Step 1580—updating the previously selected phase p as c. Thus, p=c. Waiting for a next input clock pulse and returning to Step 1530.

Method 1500 is based on the clock stretcher architecture of FIG. 5. However, an embodiment with small changes can be applied to the architecture of FIG. 4, using fixed clock 315 for phase clk_0. Also, method 1500 is based on forwarding clk_0 . . . clk_N−1 to the combiner, whereas another embodiment may be based on forwarding clk_1 . . . clk_N to the combiner. Any such variations are within the ambit and scope of the present invention.

Both method 1400 and method 1500 depend on the EOC and its difference from N1, which equals the DLL's phase error (DLL phase error 955 or DLL phase error 1055). Normally, a glitch would occur if EOC is less than N1, and a pulse of modified clock 325 would be too short. Both methods compensate for the glitch. Method 1400 compensates while wrapping phase selection around at N1, adding the phase error to the step size (the hop code) if the phase error is positive. Method 1500 compensates by wrapping phase selection around at the smaller of EOC and N1. While the methods are totally equivalent, the control unit circuitry for executing one versus the other is a bit different.

To perform method 1400, the control unit (control unit 420, control unit 520, or control unit 620) uses an EOC_Early signal that equals the DLL phase error if the DLL phase error is positive, and that equals zero otherwise. The control unit may receive the EOC_Early signal from the DLL, or derive it from the phase error, or from N1 and EOC. Thus, the DLL information must include the EOC_Early signal, the phase error, or the EOC. The control unit receives the DLL information and the hop code, as well as the DLL delay line's required length N1. Based on these, it generates a combiner control signal that includes the information for the cyclical selection of N1 delay line phase output signals. The control unit calculates a phase c to be selected by adding the hop code h to a previously selected phase p. It determines if wraparound must occur by comparing c+eoce with N1. If c+eoce>N1-1, then it wraps around by updating phase c to c+eoce mod N1.

To perform method 1500, the control unit uses the EOC signal. The control unit calculates a phase c to be selected by adding the hop code h to a previously selected phase p to obtain a sum, and performing modulo EOC on the sum if EOC is less than N1, or performing modulo N1 otherwise.

Clock Stretcher with Correction for Glitches Due to Phase Detector Offset

A clock stretcher DLL may calculate its EOC for every cycle of fixed clock 315 and lock fixed clock 315 clock cycle time T to a required number of N1 delay stages, allowing a change of N1 in runtime. Each of phase detectors 930, DLL 730, and EOC detector 1030 may have an offset, resulting in a steady-state difference between the required length of the chain of delay stages that is synchronized to fixed clock 315 cycle time T and the actual length. The steady-state difference may be less or more than the delay stage delay time Δt. Thus, phase clk_N1 may be slightly out of sync with clk_0. If phases selected from the end of the delay line are too late, then phase selection wraparound results in an output clock pulse that is too short. This type of glitch jeopardizes the overall functionality of a clock stretcher. Most clocked systems can accept a clock pulse whose cycle time is too long, but not one whose cycle time is too short.

To combat the glitch problem, a first embodiment may add an offset skip parameter value os to the hop code whenever wraparound occurs. By hopping to a higher number phase, the shortening of the output pulse is prevented. The offset skip value parameter os may be a programmable value, since the offset is static, and some overcompensation has no critical impact. A user may determine os heuristically, by simulation, or from product characterization results. A second embodiment may combat the problem by wrapping around the phase selection at a delay stage lower than N1.

FIG. 16 illustrates a first method 1600 to correct glitches due to phase detector offset in a clock stretcher according to an embodiment of the invention. The clock stretcher may have a general architecture such as clock stretcher 320 in FIG. 4, FIG. 5, or FIG. 6. Method 1600 includes the following steps.

Step 1610—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1620—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0.

Step 1630—retrieving an offset skip value os. The embodiment may retrieve the offset skip value os from a memory or a register, or os may be hardwired.

Step 1640—for a current input clock pulse, calculating a phase c of the delayed input clock based on a previously selected phase p and a hop code h by adding the hop code h to the previously selected phase p. Thus, c=p+h.

Step 1650—determining if phase selection wraparound must occur by determining if c is equal to or exceeds the last of the N1 equidistant phase (phase clk_N1−1). The embodiment selects phases from clk_0 to clk_N1−1, so after phase clk_N1−1 it must wrap around and start at the beginning. Some embodiments may determine if phase selection wraparound must occur by determining if c+os is equal to or exceeds N1 (the last of the N1 equidistant phases).

Step 1660—upon determining that phase selection wraparound must occur, adding the offset skip value os to obtain the sum of c and os, and applying modulo N1 on the sum. Thus, c=(c+os) mod N1. This step means that, when the combiner wraps around, the embodiment adds the offset skip value os to the hop code.

Step 1670—in the combiner, selecting phase c (e.g., clk_c) and forwarding it to the clock stretcher output as the modified clock.

Step 1680—updating the previously selected phase p as c. Thus, p=c. Waiting for a next input clock pulse and returning to Step 1640.

FIG. 17 illustrates a second method 1700 to correct glitches due to phase detector offset in a clock stretcher according to an embodiment of the invention. The clock stretcher may have a general architecture such as clock stretcher 320 in FIG. 4, FIG. 5, or FIG. 6. Method 1700 includes the following steps.

Step 1710—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1720—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0.

Step 1730—retrieving an offset skip value os. The embodiment may retrieve the offset skip value os from a memory or a register, or os may be hardwired.

Step 1740—for a current input clock pulse, calculating a phase c of the delayed input clock based on a previously selected phase p and a hope code h by adding the hop code h to the previously selected phase p to obtain a sum, and applying modulus (N1−1−os) to the sum. Thus, c=(p+h) mod (N1−1−os).

Step 1770—in the combiner, selecting phase c (e.g., clk_c) and forwarding it to the clock stretcher output as the modified clock.

Step 1780—updating the previously selected phase p as c. Thus, p=c. Waiting for a next input clock pulse and returning to Step 1740.

Clock Stretcher with Correction for Digital DLL Glitches

In the clock stretcher architectures illustrated in FIGS. 4-6, the DLLs may internally use either a continuous-time negative feedback loop or a discrete-time negative feedback loop to synchronize their delay with the incoming pulses of fixed clock 315. A DLL may calculate its EOC for every cycle of fixed clock 315 and lock fixed clock 315 clock cycle time T to a required number of N1 delay stages, allowing a change of N1 in runtime. If the DLL uses a discrete-time negative feedback loop with an internal clock, or if the DLL measures the delay line's delay in discrete steps (the whole number of delay stages) rather than as a continuum (the whole number plus a fraction), then changes to the delay line speed will have a discontinuous character: the delay line will suddenly become a bit faster or a bit slower. A sudden change in speed can result in shortening of a clock stretcher output pulse, a glitch that in many clocked systems can result in a timing violation and functional failure. In a digital DLL, all changes in speed are sudden, and are in sync with the digital DLL's internal clock. The internal clock may drive the DLL's phase comparator, loop filter, and other internal circuits. If the internal clock equals fixed clock 315, then potentially a glitch may occur for every pulse of fixed clock 315. If the internal clock has a lower frequency, then the potential glitches occur less often (but the DLL will respond slower to changes in N1 or the EOC). For example, if the internal clock frequency equals one eighth of the fixed clock 315 frequency, then a glitch may potentially occur on roughly every eighth cycle of the modified clock. One crude way of dealing with the problem is to lengthen the modified clock 325 pulse whenever there is an active edge of the DLL internal clock. But there is not always a speed change at every occurrence of the DLL internal clock, so a better result may be obtained by monitoring the delay line speed control signal at the output of the DLL loop filter. When it changes, there is a speed change that will affect the length of the modified clock 325 pulse. An even better result is obtained by monitoring whether the change at the output of the DLL loop filter will cause the delay line to slow down.

Traditional clock stretchers combat this problem by using a fine resolution delay line (i.e., Δt is short), but that either increases die area and power consumption or shortens the overall input frequency tuning range and limits the usability of the whole module. In contrast, an embodiment of the invention determines when a discontinuity occurs (e.g., when the DLL updates its speed), and ensures that no output clock shortening occurs by hopping one or more additional phases.

FIG. 18 illustrates a method 1800 to correct glitches due to delay line speed discontinuities in a clock stretcher according to an embodiment of the invention. The clock stretcher may have a general architecture such as clock stretcher 320 in FIG. 4 or FIG. 5. Method 1800 includes the following steps.

Step 1810—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1820—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0.

Step 1830—retrieving code change hop value cch. The embodiment may retrieve the code change hop value cch from a memory or a register, or cch may be hardwired.

Step 1840—for a current input clock pulse, calculating a phase c of the delayed input clock based on a previously selected phase p and a hop code h by adding the hop code h to the previously selected phase p. Thus, c=p+h.

Step 1850—determining if a change in the delay line speed occurs or may occur. To do so, the clock stretcher's control unit may monitor a DLL internal clock or a delay line speed control signal. Either signal may be included in the DLL information provided by the DLL to the control unit. In some embodiments, the DLL updates the delay line speed using the DLL internal clock, and the DLL internal clock's active edges are an indication that a delay line speed change occurs, or may occur. In an embodiment, the control unit may determine the sign and amplitude of the delay line speed change and act only for discontinuities where the delay line slows down. Alternatively, an embodiment may ignore the sign and amplitude of the delay line speed change and act whenever the delay line speed change may occur. In some embodiments, the DLL updates its delay line speed continuously. However, changes may still include a discontinuity if the number of stages locked to is measured as a discrete number. In those cases, the embodiment may measure the change, and if the change exceeds a threshold, the embodiment acts.

Step 1860—upon determining that a discontinuity in the DLL speed occurs, adding the code change hop value cch to obtain the sum of c and cch, and applying modulo N1 on the sum. Thus, c=(c+cch) mod N1.

Step 1865—upon determining that no discontinuity in the DLL speed occurs, applying modulo N1 on c. Thus, c=c mod N1.

Step 1870—in the combiner, selecting phase c (e.g., clk_c) and forwarding it to the clock stretcher output as the modified clock.

Step 1880—updating the previously selected phase p as c. Thus, p=c. Waiting for a next input clock pulse and returning to Step 1840.

Clock Stretcher with Passive Mode Jitter Reduction

A clock stretcher DLL may calculate its EOC for every cycle of fixed clock 315 and lock fixed clock 315 clock cycle time T to a required number of N1 delay stages of the DLL delay line, allowing a change of N1 in runtime. Delay lines built from a chain of logic gates, such as inverters or NAND gates, may suffer from jitter due to device and other noise. The noise increases with the number of stages that a clock pulse travels through. As a result, a delay line output phase near the end (near clk_N) has more jitter than near the beginning (near clk_0). The jitter may be undesirable in the clocked system since it makes timing closure more difficult, which could lead to a lower maximum clock frequency.

When a conventional clock stretcher changes from stretching mode (reducing the clock frequency) to passive mode (modified clock 325 has the same frequency as fixed clock 315), it stops hopping selected phases of the fixed clock and proceeds to continuously pass the same phase to the clock stretcher output, regardless of its position in the delay line.

An embodiment has an architecture such as in FIG. 4, FIG. 5, or FIG. 6. It has a passive mode and a stretching mode. In the passive mode, it forwards input clock pulses to the clock stretcher output, wherein the input clock pulses are delayed by fewer than 10 delay stages of the DLL delay line. For example, it may bypass the DLL and forward fixed clock 315 directly to combiner 440 or bypass multiplexer 642. In an alternative example, it may select clk_0 or another phase output of the DLL delay line that is delayed by fewer than 10 delay stages from the fixed clock 315 input signal. This allows for a limited offset between fixed clock 315 and the phase selected for potentially longer terms as the passive-mode output signal, such that jitter is limited.

To enter passive mode, embodiments do not suddenly stop hopping when the hop code changes to zero. Instead, they may continue hopping until a passive mode entry threshold is reached. The passive mode entry threshold may depend on whether the embodiment forwards clk_0 or uses a bypass. If in passive mode it forwards clk_0, the passive mode entry threshold comprises phase selection reaching the beginning of the delay line, i.e., phase clk_0. If in passive mode it uses a bypass, the passive mode entry threshold is met earlier, to compensate for offset between fixed clock 315 and phase clk_0. This offset may be represented by a bypass skip (bs) parameter.

To facilitate continued hopping before entering passive mode, an embodiment may use a minimum hop parameter mh. Applying the minimum hop value warrants that during stretching mode the phase selection does not get stuck somewhere along the delay line, but keeps progressing towards the phase selection wraparound point N1.

FIG. 19 illustrates a first method 1900 to prevent output jitter in a clock stretcher in passive mode according to an embodiment of the invention. The method bypasses the delay line when in passive mode and deals with offset between clk_0 and the fixed clock at the delay line input. The clock stretcher may have a general architecture such as clock stretcher 320 in FIG. 6. The clock stretcher receives input clock pulses with a clock cycle time T on an input and delivers pulses of a modified clock on an output. Method 1900 comprises the following steps.

Step 1910—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1920—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0. The embodiment may also retrieve values for the minimum hop value mh and, if applicable, the bypass skip value bs.

Step 1930—retrieving the hop code h and determining if it equals zero. Upon determining that the hop code h equals zero, entering passive mode and proceeding with Step 1940. Upon determining that the hop code h does not equal zero, entering stretching mode and proceeding with Step 1950.

Step 1940—forwarding input clock pulses to the clock stretcher output, wherein the input clock pulses are delayed by fewer than 10 delay stages of the DLL delay line. An embodiment with a bypass couples fixed clock 315 with combiner 440 or with bypass multiplexer 642. An embodiment without a bypass selects clk_0, or a phase output close to clk_0 and fewer than 10 delay stages of the DLL delay line from the delay line input, and forwards it via the combiner to the clock stretcher output. The embodiment is in passive mode, during which no changes to phase selection need to occur, and returns to Step 1930.

Step 1950—delaying the input clock pulses in a delay line including delay stages in the DLL; and in the DLL, locking a delay of N1 delay stages to clock cycle time T and forwarding N1 equidistant phases of the delayed input clock to the combiner.

Step 1960—calculating a phase c based on a previously selected phase p, the hop code h, and the minimum hop code value mh. The phase c equals p plus mh if the hop code h equals zero. Otherwise, the phase c equals (p+h) modulus N1.

Step 1970—determining if phase c meets the passive mode entry threshold. The threshold includes two conditions. The first condition is that the hop code h must equal zero. In an embodiment that selects clk_0, the second condition is that phase c is equal to or larger than N1. In an embodiment that bypasses the delay line, the second condition is that phase c plus bypass skip value bs is equal to or larger than N1. Upon meeting the passive mode entry threshold, the embodiment proceeds to Step 1940.

Step 1980—in the combiner, selecting phase c (e.g., clk_c) and forwarding it to the clock stretcher output as the modified clock. The combiner selects the delay line output associated with clk_c and couples it with the clock stretcher output to deliver the modified clock.

Step 1990—updating the previously selected phase p as c. Thus, p=c. Waiting for a next input clock pulse and returning to Step 1960.

Considerations

The technology disclosed can be practiced as a system or method. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

Although the description has been described with respect to particular embodiments thereof, these particular embodiments are merely illustrative, and not restrictive. The description may reference specific structural embodiments and methods, and does not intend to limit the technology to the specifically disclosed embodiments and methods. The technology may be practiced using other features, elements, methods and embodiments. Embodiments are described to illustrate the present technology, not to limit its scope, which is defined by the claims. Those of ordinary skill in the art recognize a variety of equivalent variations on the description above. For example, although the described embodiments sense a supply voltage, other embodiments may alternatively or additionally sense the temperature. They may also take the implementation's innate speed into account, such as determined by manufacturing conditions. An IC's maximum speed is generally determined by its PVT parameters: Process (manufacture), Voltage (e.g., the supply voltage), and Temperature. The figures outline three DLL architectures that are suitable for embodiments of the invention, but many more are known in the art. Any DLL capable of synchronizing a clock to a programmable delay line length may be suitable.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular embodiments thereof, these particular embodiments are merely illustrative, and not restrictive. For instance, many of the operations can be implemented on a printed circuit board (PCB) using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. Embodiments may be as a single chip, or as a multi-chip module (MCM) packaging multiple semiconductor dies in a single package. All such variations and modifications are to be considered within the ambit of the present invention the nature of which is to be determined from the foregoing description.

Any suitable technology for manufacturing electronic devices can be used to implement the circuits of particular embodiments, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

As used herein, the term "and/or" should be interpreted to mean one or more items. For example, the phrase "A, B, and/or C" should be interpreted to mean any of: only A, only B, only C, A and B (but not C), B and C (but not A), A and C (but not B), or all of A, B, and C. As used herein, the phrase "at least one of" should be interpreted to mean one or more items. For example, the phrase "at least one of A, B, and C" or the phrase "at least one of A, B, or C" should be interpreted to mean any of: only A, only B, only C, A and B (but not C), B and C (but not A), A and C (but not B), or all of A, B, and C. As used herein, the phrase "one or more of" should be interpreted to mean one or more items. For example, the phrase "one or more of A, B, and C" or the phrase "one or more of A, B, or C" should be interpreted to mean any of: only A, only B, only C, A and B (but not C), B and C (but not A), A and C (but not B), or all of A, B, and C.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim as follows:

1. A method to correct glitches due to phase detector offset in a clock stretcher, wherein the clock stretcher receives input clock pulses with a clock cycle time T on an input and delivers pulses of a modified clock on an output, the method comprising the following steps:

delaying the input clock pulses in a delay line including delay stages in a DLL;

receiving a required length value N1 that may be changed in runtime;

determining an end-of-chain (EOC) value for an input clock pulse traveling through the delay line;

in the DLL, locking a delay of N1 delay stages to the clock cycle time T and forwarding N1 phases of the delayed input clock pulses to a combiner;

cyclically selecting and coupling at least one of the N1 phases with the clock stretcher output to obtain the modified clock, wherein a phase selection step size for successive modified clock pulses is determined by a hop code h that is dependent on a sensed condition;

retrieving an offset skip parameter value os; and using the offset skip parameter value os during a phase selection wraparound to correct for a phase detector offset glitch.

2. The method of claim 1, wherein cyclically selecting at least one of the N1 phases comprises:
- calculating a phase c of the delayed input clock pulses by adding the hop code h to a previously selected phase p;
- determining if the phase selection wraparound must occur by determining if the phase c exceeds a last of the N1 phases;
- upon determining that the phase selection wraparound must occur, updating the phase c by adding the offset skip value os to obtain a sum and applying modulo N1 to the sum; and
- in the combiner, selecting the phase c from the N1 phases and coupling it with the clock stretcher output to forward a next of the delayed input clock pulses to the clock stretcher output.

3. The method of claim 2, wherein determining if the phase selection wraparound must occur comprises determining if the phase c exceeds the last of the N1 phases.

4. The method of claim 2, wherein determining if the phase selection wraparound must occur comprises determining if the phase c plus the offset skip value os exceeds the last of the N1 phases.

5. The method of claim 1, wherein cyclically selecting at least one of the N1 phases comprises:
- calculating a phase c of the delayed input clock pulses by adding the hop code h to a previously selected phase p to obtain a sum and applying modulo (N1−os) to the sum; and
- in the combiner, selecting the phase c from the N1 phases and coupling it with the clock stretcher output to forward a next of the delayed input clock pulses to the clock stretcher output.

6. The method of claim 1, wherein the sensed condition includes a voltage of a sensed power supply.

7. The method of claim 6, wherein the sensed power supply powers the DLL without intervening voltage regulation.

8. The method of claim 1, wherein a first of the N1 phases equals an undelayed version of the received input clock pulses.

9. The method of claim 1, wherein a first of the N1 phases equals a delayed version of the received input clock pulses.

10. A clock stretcher comprising:
- a clock input configured for receiving an input clock;
- a required length input configured for receiving a parameter N1;
- a delay-locked loop (DLL) including a delay line with two or more delay stages, wherein: a delay line input is electrically coupled with the clock input;
- a DLL phase comparator and a DLL loop filter operate at a speed slower than the input clock;
- the DLL is operable to lock a delay of an active part of the delay line to a duration of a cycle of the input clock; and
- the active part of the delay line has a length of N1 delay stages;
- an end-of-chain (EOC) detector, operable to detect a clock signal pulse edge present on at least a part of the delay stages, and to provide an EOC number associated with a delay stage in which the clock pulse edge is detected;
- a control unit operable to:
  - receive the parameter N1, a hop code h, and an offset skip value os;
  - output a combiner control signal including a combiner address based on a cyclical selection of N1 delay line phase output signals, wherein the cyclical selection progresses based on N1, the hop code h and the offset skip value os; and
- a combiner operable to select at least one of the N1 delay line phase output signals based on the combiner address, and to forward the at least one of the N1 delay line phase output signals to a modified clock output.

11. The clock stretcher of claim 10, wherein the control unit is further operable to:
- for the cyclical selection, calculate a phase c to be selected by adding the hop code h to a previous phase p;
- determine if a wraparound must occur by determining if c exceeds N1−1; and
- update phase c if the wraparound must occur by adding the offset skip value os to obtain a sum, and by applying modulo N1 to the sum.

12. The clock stretcher of claim 10, wherein the control unit is further operable to:
- for the cyclical selection, calculate a phase c to be selected by adding the hop code h to a previous phase p to obtain a sum, subtracting the offset skip value os from N1 to obtain a difference, and applying modulo the difference to the sum.

13. The clock stretcher of claim 10, wherein the hop code h depends on a sensed condition.

14. The clock stretcher of claim 13, wherein the sensed condition includes a voltage level.

15. The clock stretcher of claim 10, wherein:
- the clock stretcher delivers a modified clock to a clocked system powered by a power supply; and
- the DLL is powered by the power supply without intervening voltage regulators.

16. The clock stretcher of claim 10, wherein the EOC detector includes a series of phase detectors electrically coupled with the at least a part of the delay stages.

17. The clock stretcher of claim 10, wherein the EOC detector includes a series of clocked comparators with inputs that are electrically coupled with the at least a part of the delay stages and with outputs electrically coupled with combinatorial logic to detect the clock signal pulse edge, wherein the combinatorial logic outputs the EOC number.

18. A clock stretcher circuit, comprising:
- a delay locked loop (DLL), having a delay line with a plurality of stages and phase detectors connected to at least a part of the stages in the plurality of stages, to lock the delay line in response to a phase error signal, and a circuit to calculate the phase error signal as a difference between a target active length N1 of the delay line and an actual length EOC;
- a voltage detector which generates a first control signal (hop count) in response to a sensed supply voltage;
- a register to store an offset skip value os;
- a control circuit connected to the phase detectors; and
- a clock combiner circuit, having inputs connected to outputs of the plurality of stages of the DLL and to the control circuit, to generate spaced out output clock pulses in dependence on the first control signal, and the offset skip value os.

19. The clock stretcher circuit of claim 18, wherein:
the control circuit includes a circuit that calculates a phase selection wraparound signal and that adds the offset skip value os to the first control signal based on the phase selection wraparound signal.

* * * * *